(12) United States Patent
Chiu et al.

(10) Patent No.: US 10,219,408 B2
(45) Date of Patent: Feb. 26, 2019

(54) WATER-COOLING RADIATOR STRUCTURE

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 0 days.

(21) Appl. No.: 15/275,498

(22) Filed: Sep. 26, 2016

(65) Prior Publication Data
US 2018/0092248 A1 Mar. 29, 2018

(51) Int. Cl.
| | |
|---|---|
| F28F 7/00 | (2006.01) |
| F28D 1/04 | (2006.01) |
| F28D 7/06 | (2006.01) |
| H05K 7/20 | (2006.01) |
| F28F 3/08 | (2006.01) |
| F28F 9/02 | (2006.01) |
| F28F 3/04 | (2006.01) |
| F28F 3/10 | (2006.01) |
| F28D 9/00 | (2006.01) |

(52) U.S. Cl.
CPC ........... H05K 7/20263 (2013.01); F28D 9/00 (2013.01); F28F 3/04 (2013.01); F28F 3/086 (2013.01); F28F 3/10 (2013.01); F28F 9/0221 (2013.01); *F28F 2230/00* (2013.01)

(58) Field of Classification Search
CPC .............. H01L 23/4735; H01L 23/471; H05K 7/20345; H05K 7/20309; F28D 2021/0029; F28D 1/03; F28D 1/0477; F28D 1/0478; F28D 1/05366; F28D 1/0435; F28F 3/083; F28F 3/08; F28F 3/12; F28F 3/06; F28F 3/02; F28F 1/32
USPC ................................................ 165/176, 80.4
See application file for complete search history.

(56) References Cited

U.S. PATENT DOCUMENTS

| | | | | |
|---|---|---|---|---|
| 4,831,701 A * | 5/1989 | Yutaka | ................. | B23K 1/0012 228/183 |
| 5,125,451 A * | 6/1992 | Matthews | ................. | F28F 3/12 165/167 |
| 5,381,859 A * | 1/1995 | Minakami | ................. | F28F 3/02 165/185 |
| 6,883,592 B2 * | 4/2005 | Lee | ..................... | H01L 23/3677 165/185 |

(Continued)

*Primary Examiner* — Jason Thompson
(74) *Attorney, Agent, or Firm* — Jackson IPG PLLC; Demian K. Jackson

(57) ABSTRACT

A water-cooling radiator structure includes at least one first and at least one second sealing element and a first water-cooling radiator main body formed by a plurality of stacked first radiator elements. The second sealing element, the first radiator elements and the first sealing element are sequentially stacked and then integrally connected together through heat treating. The first and the second sealing element have one side connected to an upper and a lower side, respectively, of the first water-cooling radiator main body to seal a top and a bottom, respectively, of at least one first flow passage defined on the first water-cooling radiator main body. At least one first and second coupling section are optionally provided on the first sealing element or at two opposite ends of the first flow passage; and the first and the second coupling section are fluidly communicable with the first flow passage.

24 Claims, 17 Drawing Sheets

(56) References Cited

U.S. PATENT DOCUMENTS

| | | | |
|---|---|---|---|
| 2001/0010264 A1* | 8/2001 | Kuo | H01L 23/3672 |
| | | | 165/185 |
| 2004/0182548 A1* | 9/2004 | Lovette | F28F 3/12 |
| | | | 165/103 |
| 2007/0165190 A1* | 7/2007 | Takagi | G03B 21/16 |
| | | | 353/54 |
| 2008/0135218 A1* | 6/2008 | Taniguchi | F28F 3/086 |
| | | | 165/151 |
| 2009/0071257 A1* | 3/2009 | Neagle | G01N 3/12 |
| | | | 73/708 |
| 2009/0151912 A1* | 6/2009 | Heo | B60H 1/00328 |
| | | | 165/149 |
| 2012/0168112 A1* | 7/2012 | Scott | F28D 9/005 |
| | | | 165/11.1 |
| 2014/0231055 A1* | 8/2014 | Schalansky | F28F 3/086 |
| | | | 165/166 |
| 2014/0319672 A1* | 10/2014 | Tsubokawa | H01L 23/473 |
| | | | 257/712 |
| 2017/0045313 A1* | 2/2017 | Fennessy | F28F 13/18 |

\* cited by examiner

WATER-COOLING RADIATOR STRUCTURE

FIELD OF THE INVENTION

The present invention relates to a water-cooling radiator structure, and more particularly, to a water-cooling radiator structure that may be changefully designed and provides improved heat dissipation effect.

BACKGROUND OF THE INVENTION

With the rapid development and the expanded applications of many products from high-tech industries, such as computer and information industries, the currently available computer devices now have constantly increasing data processing speed. Presently, the electronic elements for use in computer devices are gradually miniaturized, and more integrated circuits (ICs) can be provided within one unit area than before. As a result, the heat produced by the internal electronic elements per unit area also increased. The large quantity of heat produced by the electronic elements must be timely removed from the computer devices to avoid damaged electronic elements and failed computer devices.

To lower the working temperature of the heat-producing electronic elements, a water-cooling device has been introduced into the market. The water-cooling device includes a water-cooling radiator, which is connected to a pump and a water block via two tubes. The pump drives a water-cooling liquid, or a working fluid, to flow to the water-cooling radiator, so that heat carried by the water-cooling liquid is transferred to and dissipated from the water-cooling radiator into ambient environment. The pump drives the water-cooling liquid to continuously circulate between the water-cooling radiator and the water block to enable quick removal of heat from the heat-producing electronic elements. FIG. 19 shows a conventional water-cooling radiator 4, which is mainly assembled from three independent parts, namely, a plurality of serpentine radiating fins 41, a plurality of flat pipes 42 and two side water tanks 43. The serpentine radiating fins 41 are arranged between any two adjacent flat pipes 42 and are connected at outer sides of all turning points thereof to outer surfaces of corresponding flat pipes 42 by way of soldering to form a subassembly. Therefore, the flat pipes 42 are in only point contact with the serpentine radiating fines 41. The two side water tanks 43 are also soldered to two opposite sides of the subassembly of the radiating fins 41 and the flat pipes 42, so that the two side water tanks 43 are connected to the radiating fins 41 and the flat pipes 42 to form the water-cooling radiator 4. One of the two side water tanks 43 is provided with a water inlet 431 while the other side water tank 43 is provided with a water outlet 432. The above mentioned two tubes (not shown) are respectively connected at one end to the water inlet 431 and the water outlet 432 on the water-cooling radiator 4.

The conventional water-cooling radiator 4 achieves the heat-dissipation effect because the heat carried by the working fluid flowing through the flat pipes 42 is transferred to the radiating fins 41, from where the heat is radiated into ambient environment. However, the conventional water-cooling radiator 4 has a problem of poor efficiency of heat transfer from the working fluid to the radiating fins 41. This is because the radiating fins 41 and the flat tubes 42 are two independent parts. While the radiating fins 41 are connected to the flat pipes 42 by soldering, the radiating fins 41 are not an integral part of the flat pipes 42. Therefore, thermal resistance occurs when the heat carried by the working fluid is transferred from the flat pipes 42 to the radiating fins 41 to cause lowered heat transfer efficiency, which in turn results in lowered cooling performance or lowered heat exchange efficiency of the whole water-cooling radiator 4. Further, since the serpentine radiating fins 41 are soldered at the outer sides of the turning points thereof to the outer surfaces of the flat pipes 42, the radiating fins 41 respectively have a structurally relatively weak middle section 411, which tends to become damaged or deformed when being subjected to an external force. Further, the effect of heat transfer from the flat pipes 42 to the radiating fins 41 is also relatively poor.

Moreover, since the conventional water-cooling radiator 4 is assembled from three independent parts, it involves complicated assembling processes that require considerably high time and labor cost.

SUMMARY OF THE INVENTION

To solve the problems in the prior art water-cooling radiator, a primary object of the present invention is to provide a water-cooling radiator structure that may be changefully designed and provides improved cooling effect.

Another object of the present invention is to provide a water-cooling radiator structure that has upgraded heat transfer efficiency and includes fins with increased structural strength.

To achieve the above and other objects, the water-cooling radiator structure according to one embodiment of the present invention includes at least one first sealing element, at least one second sealing element, and a plurality of first radiator elements. The first radiator elements are stacked to form a first water-cooling radiator main body; and each of the first radiator elements has at least one first slot, which penetrates the first radiator element in a thickness direction thereof. The first slots of the stacked first radiator elements together define at least one first flow passage on the first water-cooling radiator main body. The first and the second sealing element have one side connected to an upper and a lower side of the first water-cooling radiator main body, respectively, to seal a top and a bottom of the first flow passage, respectively. At least one first coupling section is optionally provided on the first sealing element or at a first end of the first flow passage, and at least one second coupling section is optionally provided on the first sealing element or at a second end of the first flow passage; and the first and the second coupling section are fluidly communicable with the first flow passage. With the above arrangements, the water-cooling radiator structure of the present invention can effectively achieve improved cooling effect.

According to another embodiment of the present invention, the water-cooling radiator structure includes at least one first sealing element, at least one second sealing element, and a plurality of first radiator elements. The first radiator elements are stacked to form a first water-cooling radiator main body; and each of the first radiator elements has a first communicating opening, a second communicating opening, and at least one first slot fluidly communicable with the first and second communicating openings. The first slot and the first and second communicating openings penetrate the first radiator element in a thickness direction thereof. The first slots of the stacked first radiator elements together define at least one first flow passage on the first water-cooling radiator main body, and the first and the second communicating openings of the stacked first radiator elements define a first reservoir and a second reservoir, respectively, on the first water-cooling radiator main body. The first and the second sealing element have one side connected to an upper and a lower side of the first water-cooling radiator main body, respectively, to seal tops and bottoms, respectively, of the first flow passage, the first reservoir and the second reservoir; and the first reservoir is fluidly communicable with the second reservoir via the first flow passage. At least one first coupling section is optionally provided on the first sealing element or on one side of the first water-cooling radiator main body located adjacent to the first reservoir, and at least one second coupling section is optionally provided on the first sealing element or on another side of the first water-cooling radiator main body located adjacent to the second reservoir; and the first and the second coupling section are fluidly communicable with the first and the second reservoir, respectively. With the above arrangements, the water-cooling radiator structure of the present invention can effectively achieve improved cooling effect.

According to an operable embodiment of the present invention, the second sealing element has at least one second flow passage sealing section, a plurality of third fins, and two opposite second reservoir sealing sections. Every second flow passage sealing section has two opposite ends integrally connected to the two second reservoir sealing sections and is located and extended between the two second reservoir sealing sections. The second flow passage sealing section and the two second reservoir sealing sections have one side connected to the lower side of the first water-cooling radiator main body to seal the bottom of the first flow passage and the bottoms of the first and second reservoirs, respectively. The third fins are outward extended from two opposite lateral sides of every second flow passage sealing section.

According to another operable embodiment of the present invention, the water-cooling radiator structure further includes a plurality of second radiator elements, at least one third coupling section, at least one fourth coupling section, and at least one third sealing element. The second radiator elements are stacked between the second and the third sealing element to form a second water-cooling radiator main body; and each of the second radiator elements has at least one second slot, a third communicating opening and a fourth communicating opening, which penetrate the second radiator element in a thickness direction thereof. The second slot on each second radiator element is located between and fluidly communicable with the third and the fourth communicating opening. The second slots of the stacked second radiator elements together define at least one second flow passage on the second water-cooling radiator main body, and the third and the fourth communicating openings on the stacked second radiator elements define a third reservoir and a fourth reservoir, respectively, on the second water-cooling radiator main body. The second sealing element has another side and the third sealing element has one side being connected to an upper and a lower side, respectively, of the second water-cooling radiator main body to seal tops and bottoms, respectively, of the second flow passage, the third reservoir and the fourth reservoir. The third reservoir is fluidly communicable with the fourth reservoir via the second flow passage. The third coupling section is optionally provided on the third sealing element or on one side of the second water-cooling radiator main body located adjacent to the third reservoir, and the fourth coupling section is optionally provided on the third sealing element or on another side of the second water-cooling radiator main body located adjacent to the fourth reservoir; and the third and the fourth coupling section are fluidly communicable with the second flow passage.

According to a further operable embodiment of the present invention, the water-cooling radiator structure further includes two opposite casings connected to two opposite lateral sides of the water-cooling radiator main body. The casings respectively have a plurality of retaining sections outward extended from one side of the casings to abut on outer surfaces of the first and the second sealing element. With the two casings, the first water-cooling radiator main body is well protected.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
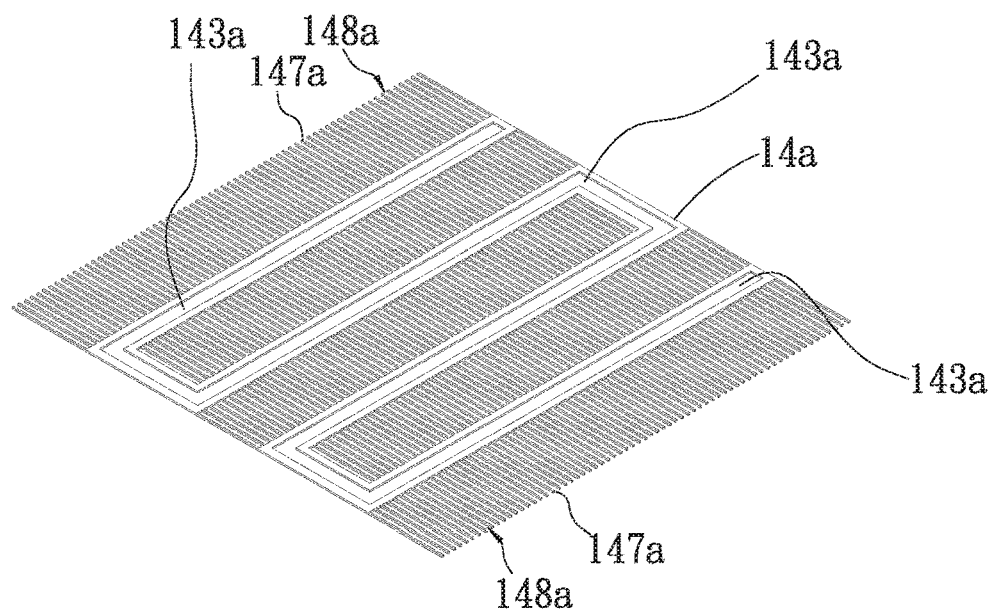
FIG. 1 is a perspective view of a first radiator element for a water-cooling radiator structure of the present invention.

The present invention will now be described with some preferred embodiments thereof and by referring to the accompanying drawings. For the purpose of easy to understand, elements that are the same in the preferred embodiments are denoted by the same reference numerals.

Figure 2:
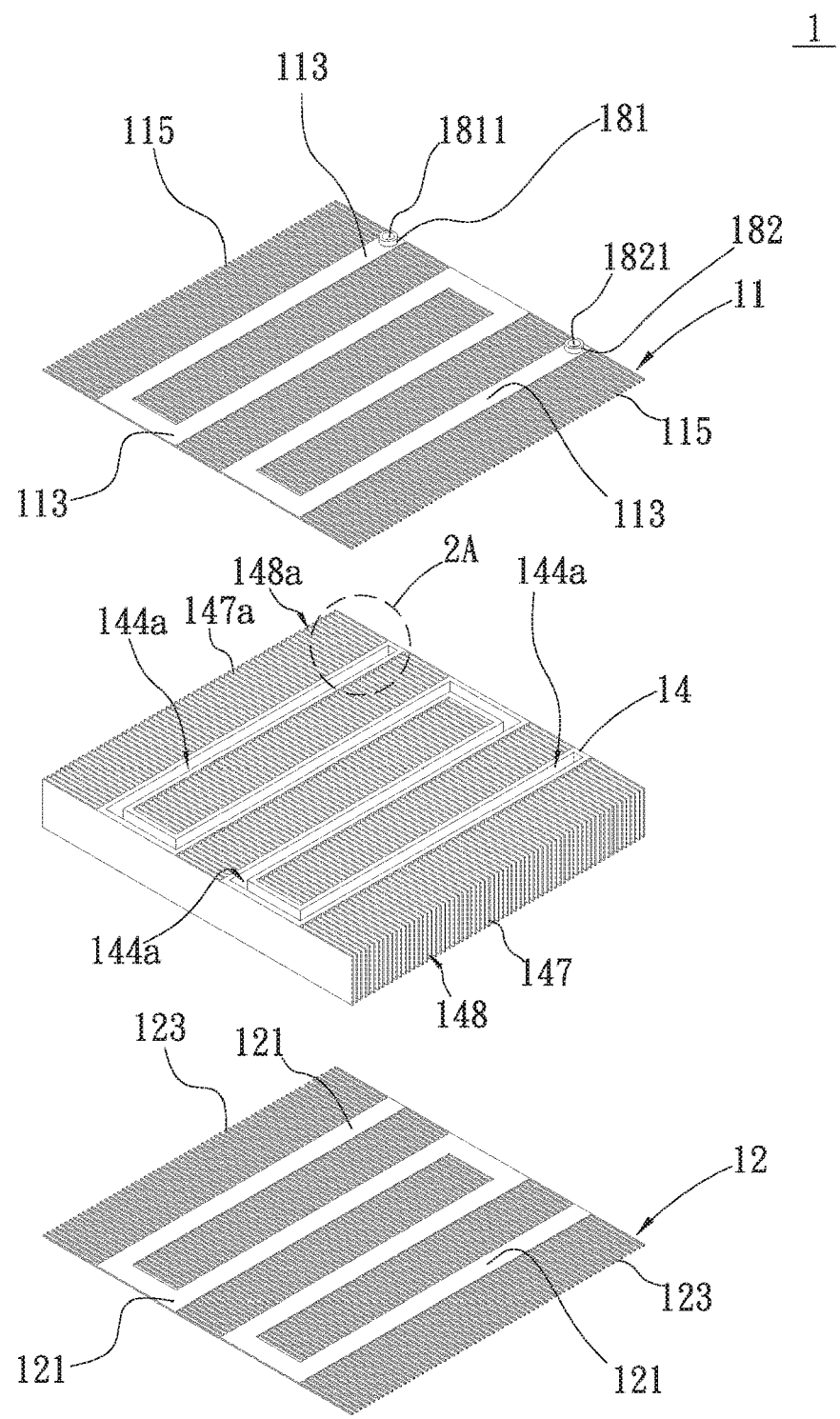
FIG. 2 is an exploded perspective view of the water-cooling radiator structure according to a first embodiment of the present invention.
Figure 2A:
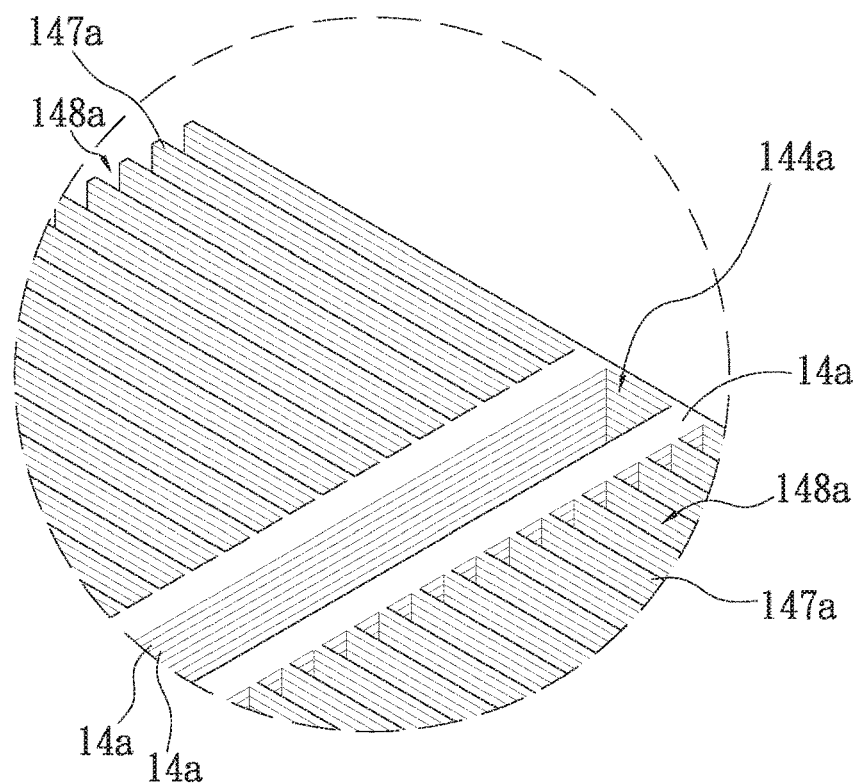
FIG. 2A is an enlarged view of the circled area 2A of FIG. 2.
Figure 3:
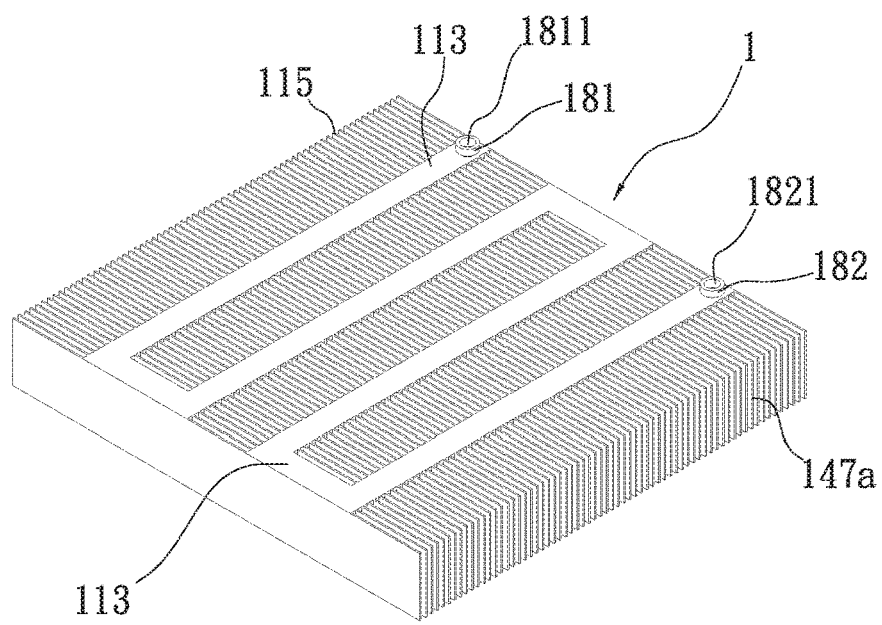
FIG. 3 is an assembled perspective view of the water-cooling radiator structure according to the first embodiment of the present invention.

Please refer to FIGS. 2 and 3 along with FIGS. 1 and 2A, wherein FIGS. 2 and 3 are respectively exploded and assembled perspective views of a water-cooling radiator structure 1 according to a first embodiment of the present invention, FIG. 1 is a perspective view of a first radiator element 14a for the water-cooling radiator structure 1 of FIG. 2, and FIG. 2A is an enlarged view of the circled area 2A of FIG. 2. The water-cooling radiator structure 1 in the first embodiment includes at least one first sealing element 11, at least one second sealing element 12, at least one first coupling section 181, at least one second coupling section 182, and a plurality of first radiator elements 14a. The first radiator elements 14a are stacked to form a first water-cooling radiator main body 14. In the illustrated first embodiment, the first radiator elements 14a are sheet members made of a metal material, such as copper, aluminum, stainless steel, magnesium-aluminum alloy, titanium, or other materials or composite materials with good ductility and malleability as well as good thermal conductivity. Each of the first radiator elements 14a includes a plurality of first fins 147a and at least one first slot 143a. The first fins 147a are outward extended from portions of the first radiator element 14a located adjacent to two opposite lateral sides of the first slot 143a for dissipating absorbed heat into ambient environment. An opening 148a is formed between any two adjacent first fins 147a. The openings 148a allow external air to flow therethrough and accordingly, enable quick heat exchange between the external air and the first fins 147a. In the illustrated first embodiment, the first slot 143a on each of the first radiator elements 14a is a winding slot including a plurality of turns and penetrates the first radiator element 14a in a thickness direction thereof. The first slot 143a has two ends, i.e. a front end and a rear end, which are located at the same side of the first radiator element 14a. The first slots 143a of the stacked first radiator elements 14a together define at least one first flow passage 144a on the first water-cooling radiator main body 14. In the illustrated first embodiment, the first flow passage 144a is a winding flow passage including a plurality of turns. In practical implementation of the first embodiment of the present invention, the design and the number of the first slots 143a can be adjusted according to actual need for heat dissipation and the space available. Further, it is also possible to select a curved, a W-shaped, a V-shaped or any other suitably shaped first slot 143a.

The first and second sealing elements 11, 12 and the first radiator elements 14a are stacked and connected to form the water-cooling radiator structure 1. In other words, the second sealing element 12, the first radiator elements 14a and the first sealing element 11 are sequentially stacked from bottom to top and then integrally connected together through heat treating to form the water-cooling radiator structure 1. More specifically, the first and the second sealing element 11, 12 are respectively integrally connected at one side to an upper and a lower side of the first water-cooling radiator main body 14 to seal a top and a bottom of the first flow passage 144a. In other operable embodiments, a plurality of first flow passages 144a may be provided. The number of the first flow passages 144a is defined by the number of the first slots 143a formed on each of the first radiator elements 14a. In the case each of the first radiator elements 14a has a plurality of first slots 143a, there will be the same number of first flow passages 144a correspondingly defined on the first water-cooling radiator main body 14.

The first coupling section 181 can be optionally provided on the first sealing element 11 or at an end of the first flow passage 144a; and the second coupling section 182 can be optionally provided on the first sealing element 11 or at another end of the first flow passage 144a. In the illustrated first embodiment, the first and the second coupling section 181, 182 are provided on the first sealing element 11. The first and the second coupling section 181, 182 respectively define a first water-guiding hole 1811 and a second water-guiding hole 1821, which respectively extend through the first coupling section 181 and the second coupling section 182. In the illustrated first embodiment, there is one first water-guiding hole 1811 that is located corresponding to and communicates with a front end of the first flow passage 144a, and there is one second water-guiding hole 1821 that is located corresponding to and communicates with a rear end of the first flow passage 144a. Further, the first and the second water-guiding hole 1811, 1821 are respectively used as a water inlet and a water outlet in the first embodiment. That is, the first water-guiding hole 1811 of the first coupling section 181 is a water inlet for guiding a working fluid, such as pure water or other water-cooling liquid, into one end, or the front end, of the first flow passage 144a to flow along the winding first flow passage 144a toward the other end, or the rear end, of the first flow passage 144a. The working fluid finally leaves the water-cooling radiator structure 1 via a water outlet, i.e. the second water-guiding hole 1821 of the second coupling section 182. In other operable embodiments, it is also possible to optionally provide the first and the second coupling section 181, 182 at the front and the rear end of the first flow passage 144a, respectively, with the first and second coupling sections 181, 182 being fluidly communicable with the first flow passage 144a.

In the illustrated first embodiment, the first sealing element 11 is a sheet member made of a metal material, such as copper, aluminum, stainless steel, magnesium-aluminum alloy, titanium, or other materials or composite materials with good ductility and malleability as well as good thermal conductivity. The first sealing element 11 has at least one first flow passage sealing section 113 and a plurality of second fins 115. The first and the second coupling section 181, 182 are provided at a front end and a rear end, respectively, of the first flow passage sealing section 113. More specifically, the first flow passage sealing section 113 is corresponding to the first flow passage 144a in shape and position and has a lower side correspondingly connected to the upper side of the first water-cooling radiator main body 14 to seal the top of the first flow passage 144a. The second fins 115 are outward extended from two opposite lateral sides of the first flow passage sealing section 113 and are shaped and located corresponding to the first fins 147a. In the illustrated first embodiment, the second sealing element 12 is a sheet member made of a metal material, such as copper, aluminum, stainless steel, magnesium-aluminum alloy or titanium. The second sealing element 12 has at least one second flow passage sealing section 121 and a plurality of third fins 123. More specifically, the second flow passage sealing section 121 is corresponding to the first flow passage 144a in shape and position and has an upper side correspondingly connected to the lower side of the first water-cooling radiator main body 14 to seal the bottom of the first flow passage 144a. The third fins 123 are outward extended from two opposite lateral sides of the second flow passage sealing section 121 and are shaped and located corresponding to the first fins 147a. The second and the third fins 115, 123 are used to dissipate absorbed heat into ambient environment.

In practical implementation of the first embodiment of the present invention, the first and the second coupling section 181, 182 can be connected in a fluid communicable manner to an outlet and an inlet, respectively, of a water block (not shown) via two tubes (not shown). The water block has one side serving as a heat-absorbing surface for contacting with a heat-producing element, such as a central processing unit (CPU) or a graphic processing unit (GPU), to absorb the produced heat. A working fluid in the water block absorbs the heat produced by the heat-producing element, and the heat-carrying working fluid is driven by a pump inside the water block or externally connected to the water block to flow through the first water-guiding hole 1811 into the front end of the first flow passage 144a on the first water-cooling radiator main body 14. While the working fluid keeps flowing along the winding first flow passage 144a toward the other end thereof, the heat absorbed by the working fluid is transferred to the first, second and third fins 147a, 115, 123, from where the heat is dissipated into ambient environment by way of radiation. The working fluid is accordingly cooled and leaves the water-cooling radiator structure 1 via the second water-guiding hole 1821 of the second coupling section 182 to flow back into the water block. The working fluid continuously circulates between the water block and the water-cooling radiator structure 1 to achieve the heat dissipation effect via water cooling.

In an operable embodiment, the water-cooling radiator structure 1 has a fan (not shown) connected thereto. More specifically, the fan is connected to a top of the water-cooling radiator structure 1 to create forced dissipation of heat from the water-cooling radiator structure 1.

By forming the first slot 143a and the first fins 147a on every first radiator element 14a and forming the second and third fins 115, 123 on the first and second sealing elements 11, 12, respectively, it is possible for the heat carried by the working fluid to be transferred from each of the first radiator elements 14a directly to the first fins 147a thereof and from the first and second sealing elements 11, 12 directly to the second and third fins 115, 123 thereof. With these arrangements, largely increased heat transfer efficiency and excellent cooling efficiency can be effectively achieved. Further, by stacking the first and second sealing elements 11, 12 and the first radiator elements 14a into an integral water-cooling radiator structure 1, the water-cooling radiator structure 1 so obtained can have improved structural strength and heat dissipation effect.

According to the present invention, the first sealing element 11, the second sealing element 12 and the first radiator elements 14a can be made of the same or different metal materials.

Figure 4:
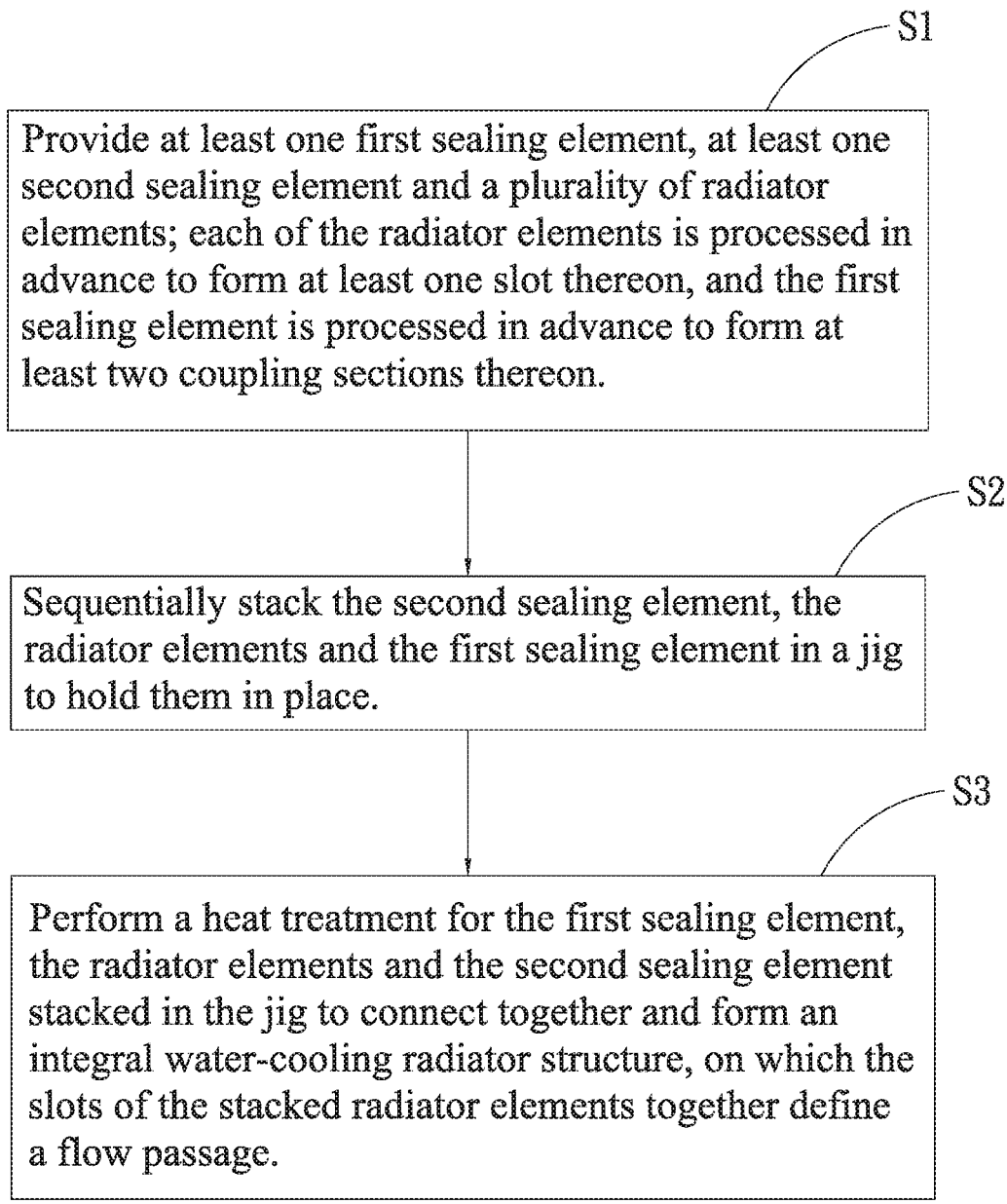
FIG. 4 is a flowchart showing the steps included in a water-cooling radiator structure manufacturing method according to a second embodiment of the present invention.

FIG. 4 is a flowchart showing the steps included in a water-cooling radiator structure manufacturing method according to a second embodiment of the present invention. Please refer to FIG. 4 along with FIGS. 2 and 3. More specifically, the illustrated second embodiment involves a method of manufacturing the water-cooling radiator structure 1 according to the first embodiment of the present invention. The following is a description of the steps included in the method according to the second embodiment of the present invention.

In a first step (S1), at least one first sealing element, at least one second sealing element, and a plurality of radiator elements are provided. Each of the radiator elements is processed in advance to form at least one slot thereon, and the first sealing element is processed in advance to form at least two coupling sections thereon.

Figure 5A:
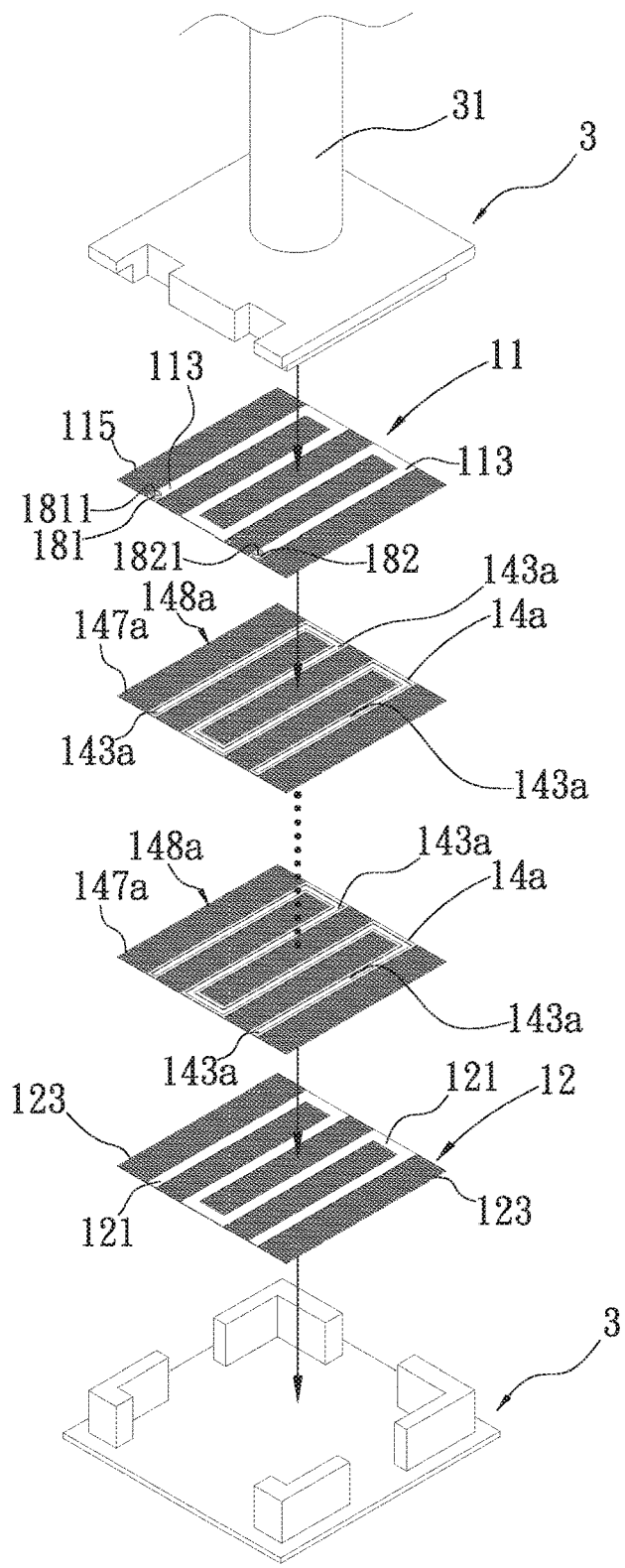
FIG. 5A illustrates the position of a first and a second sealing element and a plurality of first radiator elements into a jig according to the method of FIG. 4.

More specifically, as shown in FIG. 5A, at least one first sealing element 11, at least one second sealing element 12, and a plurality of radiator elements, such as the first radiator elements 14a, are provided. Each of the radiator elements 14a is processed in advance, so that at least one slot such as the first slot 143a and a plurality of fins such as the first fins 147a are formed on the radiator element 14a. The radiator element is so processed that the fins are outward extended from portions of the radiator element located adjacent to two opposite lateral sides of the slot for dissipating absorbed heat into ambient environment. In the illustrated second embodiment, the slot and the fins are formed on each radiator element by means of mechanical processing, such as punching. However, it is understood the slot and the fins are not necessarily formed by punching. In practical implementation of the second embodiment of the present invention, the slot and the fins can be formed on the radiator element by milling, which is also one kind of mechanical processing.

Further, in the illustrated second embodiment, the slot is a winding slot, such as the first slot 143a, which penetrates the radiator element, such as the first radiator element 143a, in a thickness direction thereof. The first sealing element 11 is also processed in advance to form two coupling sections thereon. The two coupling sections, i.e. the first and the second coupling section 181, 182, are respectively connectable to an end of a tube (not shown) in a fluid communicable manner. The two tubes are connected at another end to an outlet and an inlet, respectively, of a water block (not shown) in a fluid communicable manner. Each of the two coupling sections is formed with a water-guiding hole. In the illustrated second embodiment, the water-guiding holes of the two coupling sections include a water inlet, such as the first water-guiding hole 1811, and a water outlet, such as the second water-guiding hole 1821. The water inlet serves to guide a working fluid, such as pure water or other water-cooling liquid, into the slot; and the water outlet serves to guide the working fluid out of the slot. In the illustrated second embodiment, the first and second sealing elements 11, 12 and the radiator elements, such as the first radiator elements 14a, are sheet members made of a metal material, such as copper, aluminum, stainless steel, magnesium-aluminum alloy or titanium. Further, in practical implementation of the second embodiment of the present invention, the design and the number of the slots can be adjusted according to actual need for heat dissipation and the space available. For example, there can be two or more slots formed on each radiator element. In addition, it is also possible to select a curved, a W-shaped, a V-shaped or any other suitably shaped slot.

In a second step (S2), the second sealing element, the radiator elements and the first sealing element are sequentially stacked in a jig to be held in place.

Figure 5B:
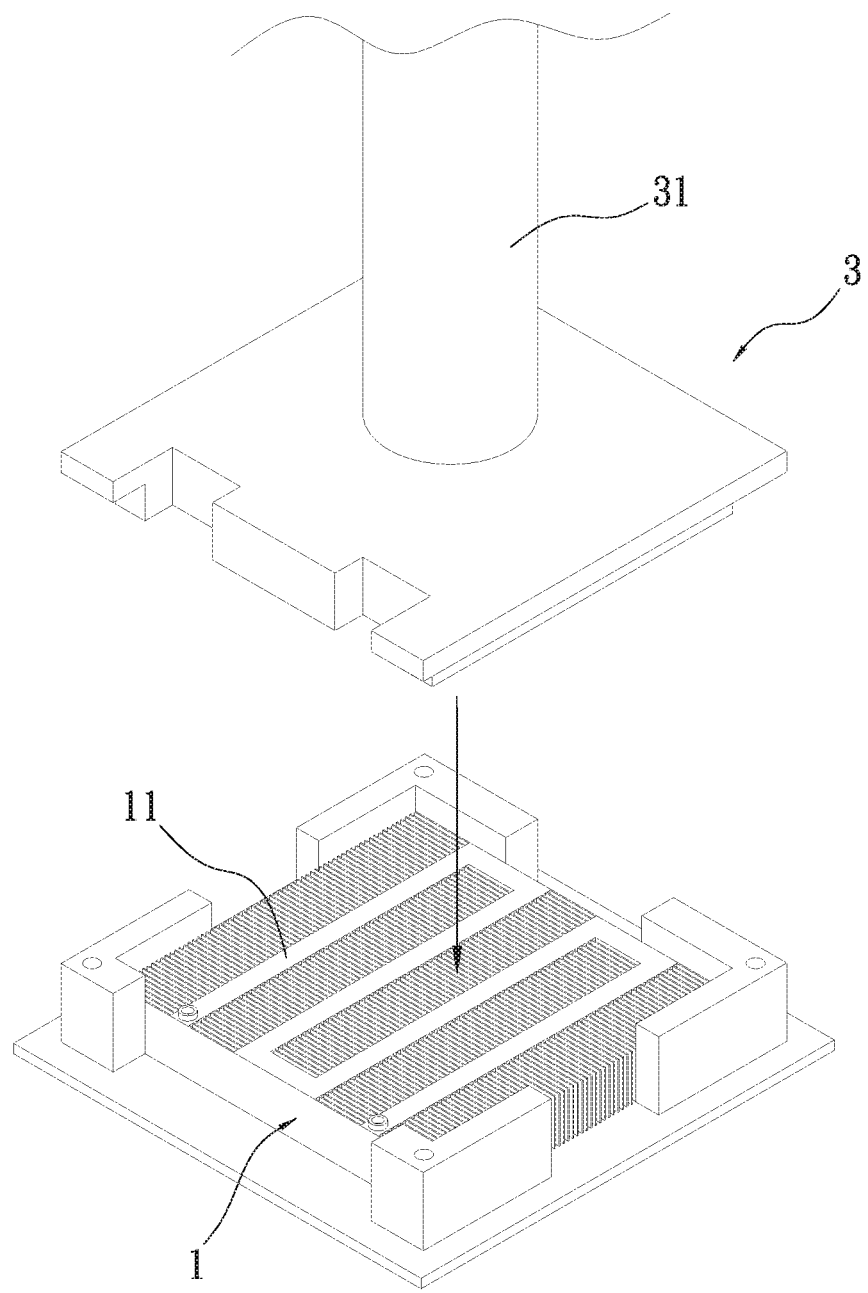
FIG. 5B illustrates the downward movement of a top press die of the jig toward the first and second sealing elements and the first radiator elements stacked in the jig according to the method of FIG. 4.
Figure 5C:
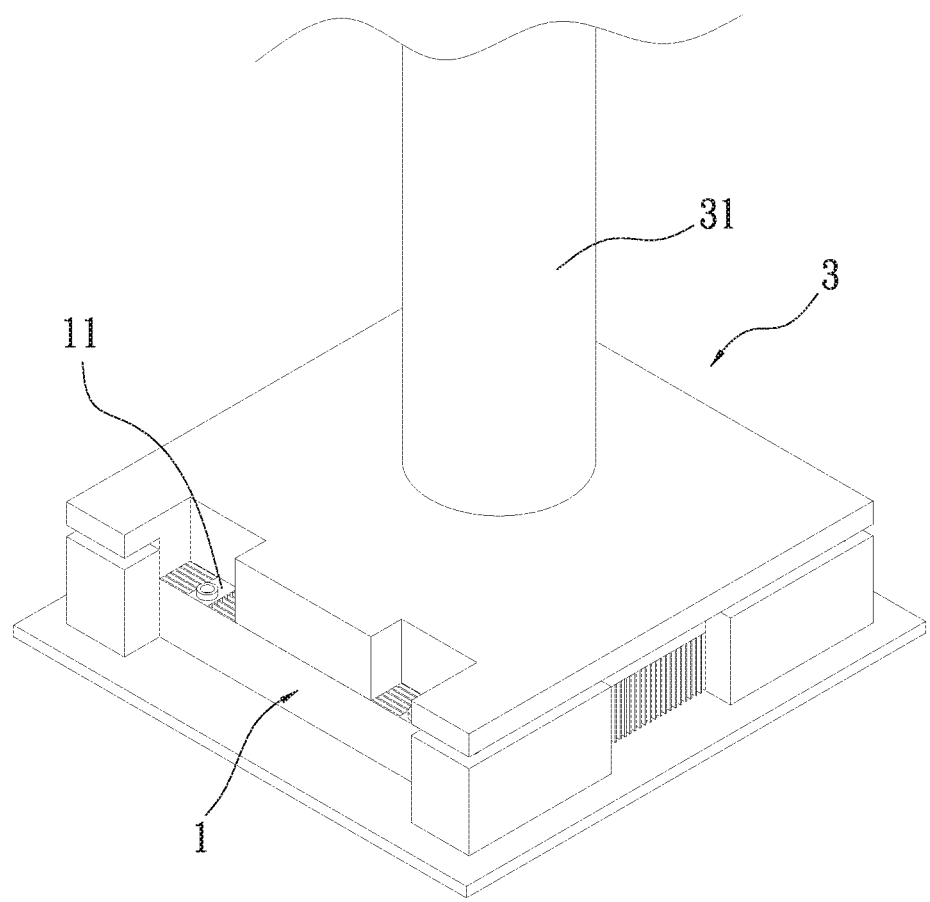
FIG. 5C illustrates the top press die of the jig is pressed against the first and second sealing elements and the first radiator elements stacked in the jig according to the method of FIG. 4.

More specifically, the second sealing element 12, the radiator elements, such as the first radiator elements 14*a*, and the first sealing element 11 are sequentially positioned in a jig 3 to be stacked from bottom to top, as shown in FIG. 5A, such that the first and the second sealing element 11, 12 are located at an upper side and a lower side, respectively, of the radiator elements stacked in the jig 3. Then, a top press die 31 of the jig 3 is moved downward to press against the first sealing element 11 and hold it in place, as shown in FIGS. 5B and 5C.

In a third step (S3), a heat treatment is performed for the first sealing element, the radiator elements and the second sealing element stacked in the jig to connect together and form an integral water-cooling radiator structure 1, such that the stacked radiator elements form a water-cooling radiator main body, the slots of the stacked radiator elements together define a flow passage on the water-cooling radiator main body, and the defined flow passage has two ends that are corresponding to and fluid communicable with the two coupling sections.

More specifically, the heat treatment is performed in a heat treating furnace, such as an atmosphere furnace, a vacuum furnace, or any other suitable heat treating furnace selected according to the materials of the sealing elements and the radiator elements. To perform the heat treatment, the first sealing element 11, the radiator elements and the second sealing element 12 stacked and held in the jig 3 are sent into the heat treating furnace, so that the stacked first and second sealing elements and the radiator elements are integrally connected together to form the water-cooling radiator structure 1 shown in FIG. 3. In the illustrated second embodiment, each of the radiator elements has one winding slot, such as the first slot 143*a*, and all the winding slots of the stacked radiator elements together define one winding flow passage, such as the first flow passage 144*a*. The flow passage has two ends, namely, a front end and a rear end, which are corresponding to and fluid communicable with the first and the second coupling section 181, 182, respectively. Further, the first and the second sealing element 11, 12 are respectively connected at one side to an upper and a lower side of the water-cooling radiator main body, i.e. the first water-cooling radiator main body 14, to seal a top and a bottom of the flow passage. The first water-guiding hole 1811 of the first coupling section 181 is a water inlet, via which the working fluid, such as pure water or other water-cooling liquid, is guided into one end, or the front end, of the flow passage to flow along the winding flow passage toward the other end, or the rear end, of the flow passage. The working fluid finally leaves the water-cooling radiator structure 1 via a water outlet, i.e. the second water-guiding hole 1821 of the second coupling section 182.

Therefore, the water-cooling radiator structure 1 manufactured with the method according to the second embodiment of the present invention has the advantages of improved heat transfer efficiency and heat dissipation effect, effectively increased structural strength, and changeable flow passage designs that meet different heat dissipation requirements.

Figure 1A:
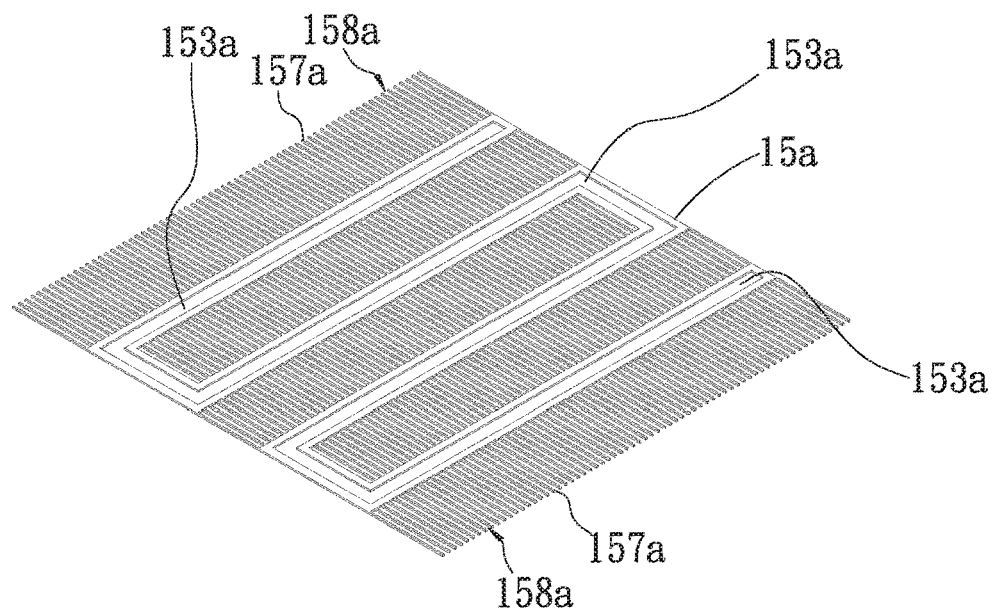
FIG. 1A is a perspective view of a second radiator element for the water-cooling radiator structure of the present invention.
Figure 6:
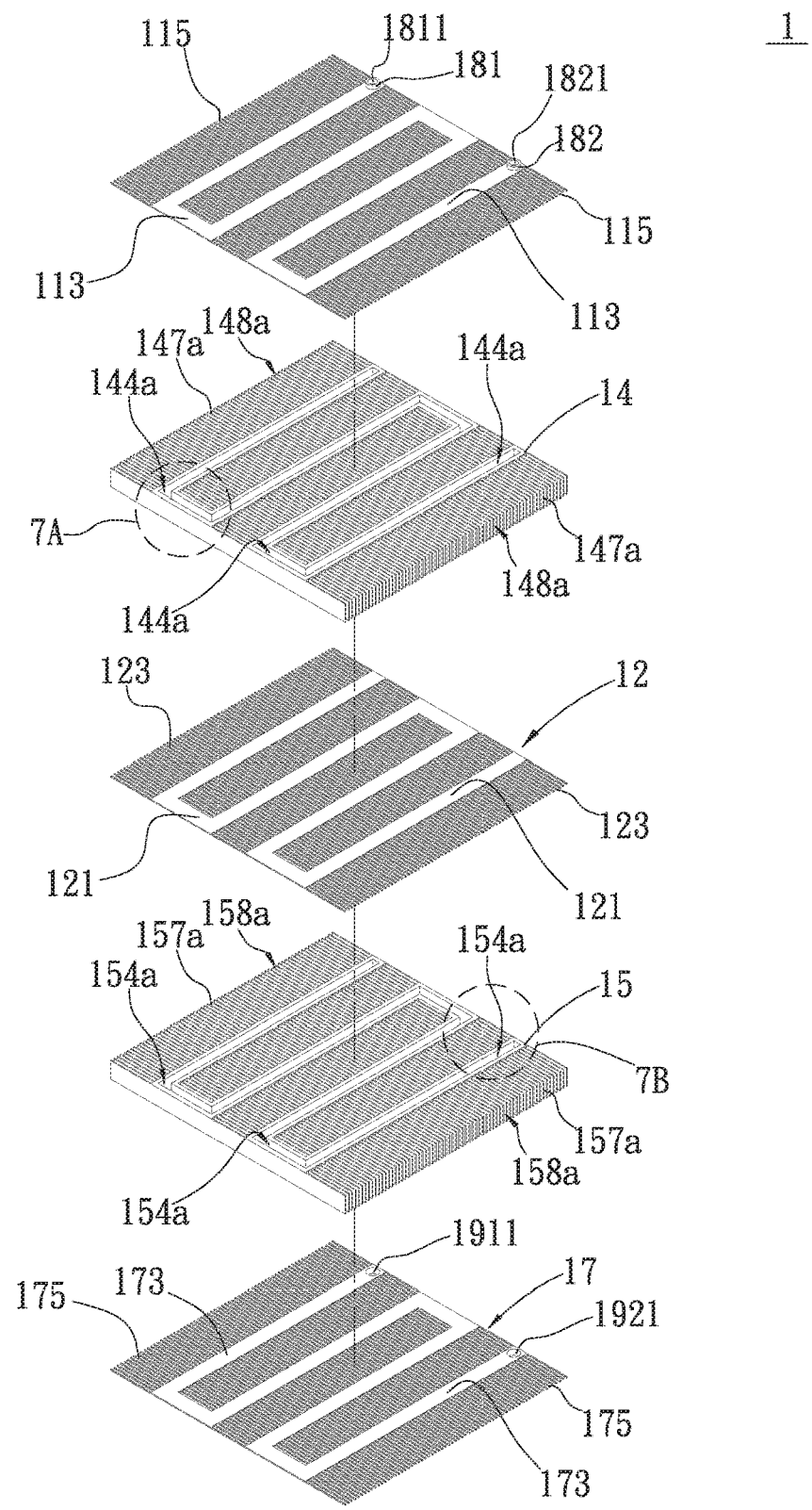
FIG. 6 is an exploded perspective view of the water-cooling radiator structure according to a third embodiment of the present invention.
Figure 7A:
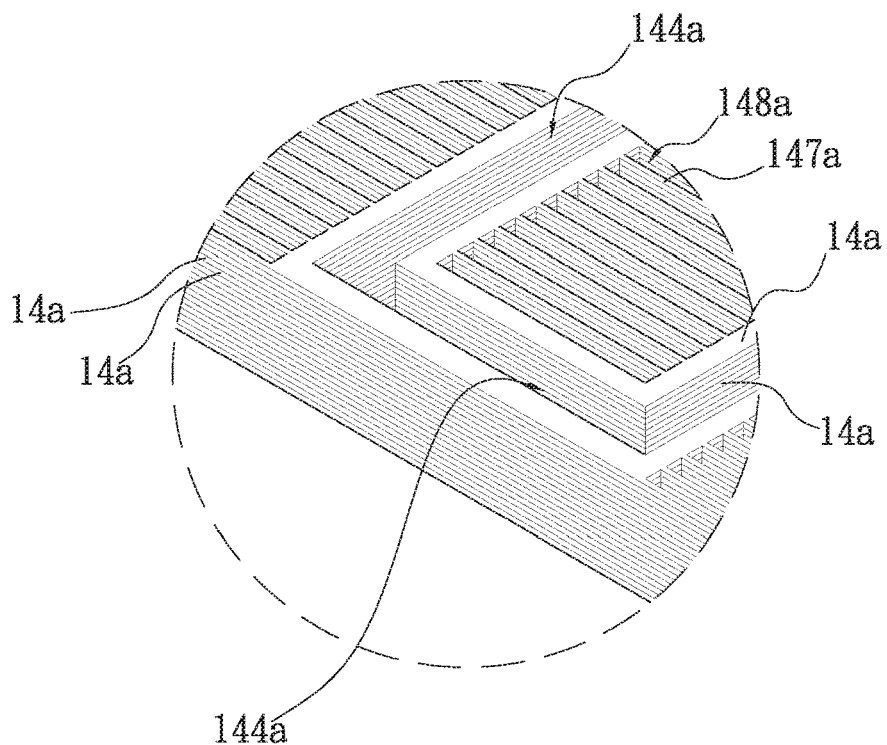
FIG. 7A is an enlarged view of the circled area 7A of FIG. 6.
Figure 7B:
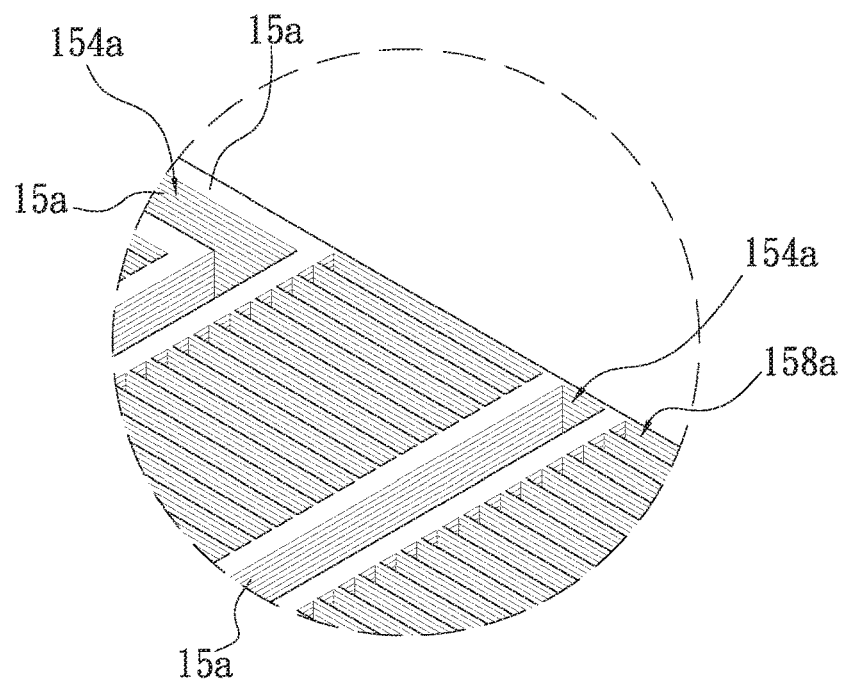
FIG. 7B is an enlarged view of the circled area 7B of FIG. 6.
Figure 8:
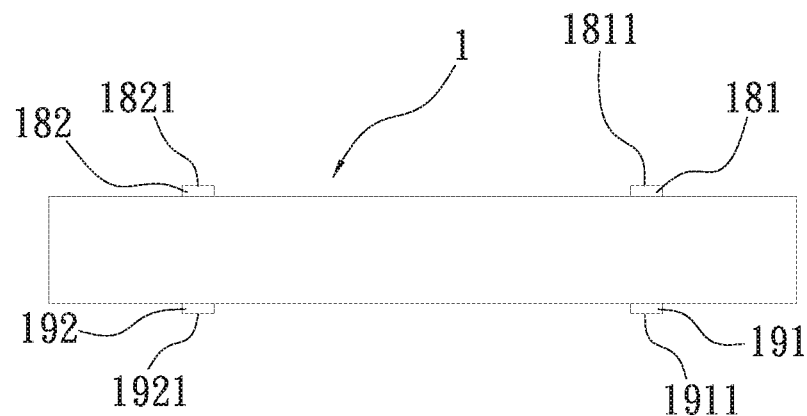
FIG. 8 is an assembled side view of the water-cooling radiator structure according to the third embodiment of the present invention.

FIGS. 6 and 8 are exploded perspective view and assembled side view, respectively, of the water-cooling radiator structure 1 according to a third embodiment of the present invention; FIG. 1A is a perspective view of a second radiator element 15*a* for the water-cooling radiator structure of FIG. 6; and FIGS. 7A and 7B are enlarged views of the circled areas 7A, 7B, respectively, of FIG. 6. Please refer to FIGS. 6 and 8 along with FIGS. 1A, 7A and 7B. Since the water-cooling radiator structure 1 according to the third embodiment is generally structurally and functionally similar to the first embodiment, the parts of the third embodiment that are the same as the first embodiment are not repeatedly described herein. The third embodiment is different from the first one in further including a plurality of second radiator elements 15*a*, at least one third coupling section 191, at least one fourth coupling section 192, and at least one third sealing element 17. In the illustrated third embodiment, the second radiator elements 15*a* are sheet members made of a metal material, such as copper, aluminum, stainless steel, magnesium-aluminum alloy or titanium, and are stacked between the second sealing element 12 and the third sealing element 17 to form a second water-cooling radiator main body 15. Each of the second radiator elements 15*a* includes at least one second slot 153*a* and a plurality of first radiating fins 157*a*. The first radiating fins 157*a* are outward extended from portions of the second radiator element 15*a* located adjacent to two opposite lateral sides of the second slot 153*a* for dissipating absorbed heat into ambient environment. A heat-dissipating opening 158*a* is formed between any two adjacent first radiating fins 157*a*. The heat-dissipating openings 158*a* allow external air to flow therethrough and accordingly, enable quick heat exchange between the external air and the first radiating fins 157*a*. In the illustrated third embodiment, the second slot 153*a* on each of the second radiator elements 15*a* is a winding slot including a plurality of turns and penetrates the second radiator element 15*a* in a thickness direction thereof. The second slot 153*a* has two ends, i.e. a front end and a rear end, which are located at the same side of the second radiator element 15*a*. The second slots 153*a* of the stacked second radiator elements 15*a* together define at least one second flow passage 154*a* on the second water-cooling radiator main body 15. In the illustrated third embodiment, the second flow passage 154*a* is a winding flow passage including a plurality of turns. In practical implementation of the third embodiment of the present invention, the design and the number of the second slots 153*a* can be adjusted according to actual need for heat dissipation and the space available. Further, it is also possible to select a curved, a W-shaped, a V-shaped or any other suitably shaped second slot 153*a*.

The first, second and third sealing elements 11, 12, 17 and the first and second radiator elements 14*a*, 15*a* are stacked and connected to form the water-cooling radiator structure 1. In other words, the third sealing element 17, the second radiator elements 15*a*, the second sealing element 12, the first radiator elements 14*a* and the first sealing element 11 are sequentially stacked from bottom to top and then integrally connected together through heat treating to form the water-cooling radiator structure 1. More specifically, the second sealing element 12 is connected at another side to an upper side of the second water-cooling radiator main body 15 and the third sealing element 17 is connected at one side to a lower side of the second water-cooling radiator main body 15 to seal a top and a bottom of the second flow passage 154*a*. In other operable embodiments, a plurality of second flow passages 154*a* may be provided. The number of the second flow passages 154*a* is defined by the number of the second slots 153a formed on each of the second radiator elements 15a. In the case each of the second radiator elements 15a has a plurality of second slots 153a, there will be the same number of second flow passages 154a correspondingly defined on the stacked second radiator elements 15a.

The third coupling section 191 can be optionally provided on the third sealing element 17 or at an end of the second flow passage 154a; and the fourth coupling section 192 can be optionally provided on the third sealing element 17 or at another end of the second flow passage 154a. In the illustrated third embodiment, the third and the fourth coupling section 191, 192 are provided on the third sealing element 17. The third and the fourth coupling section 191, 192 respectively have a third water-guiding hole 1911 and a fourth water-guiding hole 1921, which respectively extend through the third coupling section 191 and the fourth coupling section 192. In the illustrated third embodiment, there is one third water-guiding hole 1911 that is located corresponding to and communicates with a front end of the second flow passage 154a, and there is one fourth water-guiding hole 1921 that is located corresponding to and communicates with a rear end of the second flow passage 154a. Further, the third and the fourth water-guiding hole 1911, 1921 are respectively used as a water inlet and a water outlet in the third embodiment. That is, the third water-guiding hole 1911 of the third coupling section 191 is a water inlet for guiding a working fluid, such as pure water or other water-cooling liquid, into one end, or the front end, of the second flow passage 154a to flow along the winding second flow passage 154a toward the other end, or the rear end, of the second flow passage 154a. The working fluid finally leaves the water-cooling radiator structure 1 via a water outlet, i.e. the fourth water-guiding hole 1921 of the fourth coupling section 192. Further, the first, second and third sealing elements 11, 12, 17 as well as the first and second radiator elements 14a, 15a can be made of the same or different metal materials. In other operable embodiments, it is also possible to optionally provide the third and the fourth coupling section 191, 192 at the front and the rear end of the second flow passage 154a, respectively, with the third and fourth coupling sections 191, 192 being fluid communicable with the second flow passage 154a.

In the illustrated third embodiment, the third sealing element 17 is a sheet member made of a metal material, such as copper, aluminum, stainless steel, magnesium-aluminum alloy or titanium. The third sealing element 17 has at least one flow passage sealing section 173 and a plurality of second radiating fins 175. The third and the fourth coupling section 191, 192 are provided at a front end and a rear end, respectively, of the flow passage sealing section 173. More specifically, the flow passage sealing section 173 is corresponding to the second flow passage 154a in shape and position and has an upper side correspondingly connected to the lower side of the second water-cooling radiator main body 15 to seal the bottom of the second flow passage 154a. The second flow passage 154a is isolated from the first flow passage 144a by the second sealing element 12, and is accordingly, not communicable with the first flow passage 144a. The second radiating fins 175 are outward extended from two opposite lateral sides of the flow passage sealing section 173 for dissipating absorbed heat into ambient environment. Further, the second radiating fins 175 are shaped and located corresponding to the first radiating fins 157a.

In practical implementation of the present invention, the water-cooling radiator structure 1 is not necessarily used with a water block having two inlets and two outlets. That is, the water-cooling radiator structure 1 of the present invention can be used with more than one water block, depending on the actual need for heat dissipation and the number of heat-producing elements, which can be a CPU and other processing units. More specifically, the first and second coupling sections 181, 182 can be connected to a first water block while the third and fourth coupling sections 191, 192 can be connected to a second water block. With this arrangement, the two water blocks can be separately used to absorb heat produced by two heat-producing elements.

Therefore, by stacking the first, second and third sealing elements 11, 12, 17 as well as the first and second radiator elements 14a, 15a to form an integral water-cooling radiator structure 1 of the present invention, the present invention can be changefully designed for the whole water-cooling radiator structure to have effectively increased structural strength and improved heat dissipation effect and heat transfer efficiency.

Figure 9:
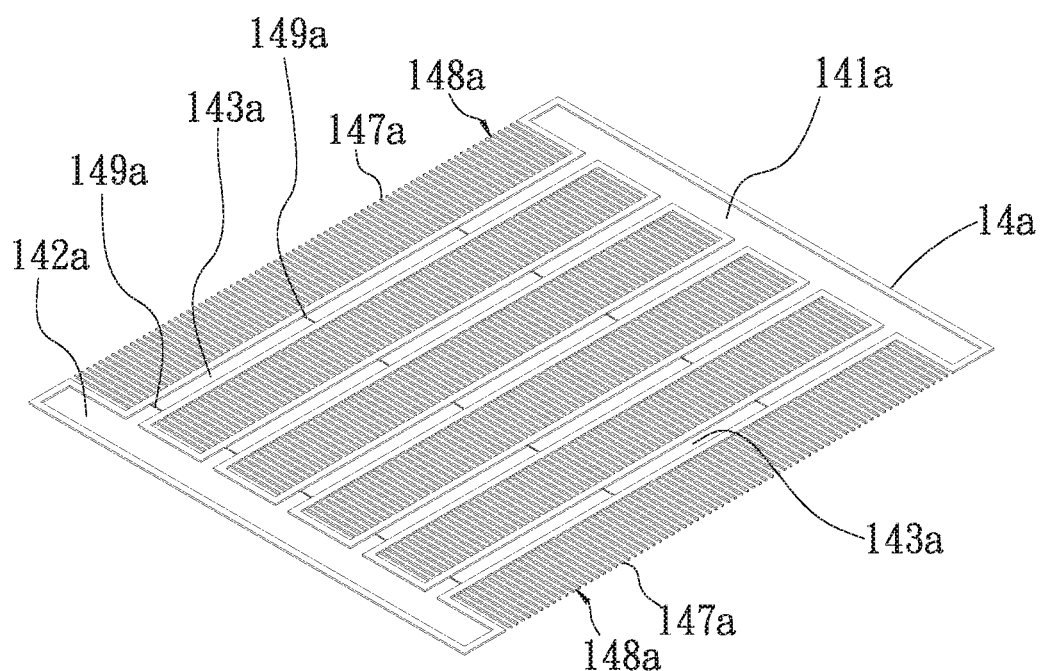
FIG. 9 is a perspective view of the first radiator element in another configuration.
Figure 10:
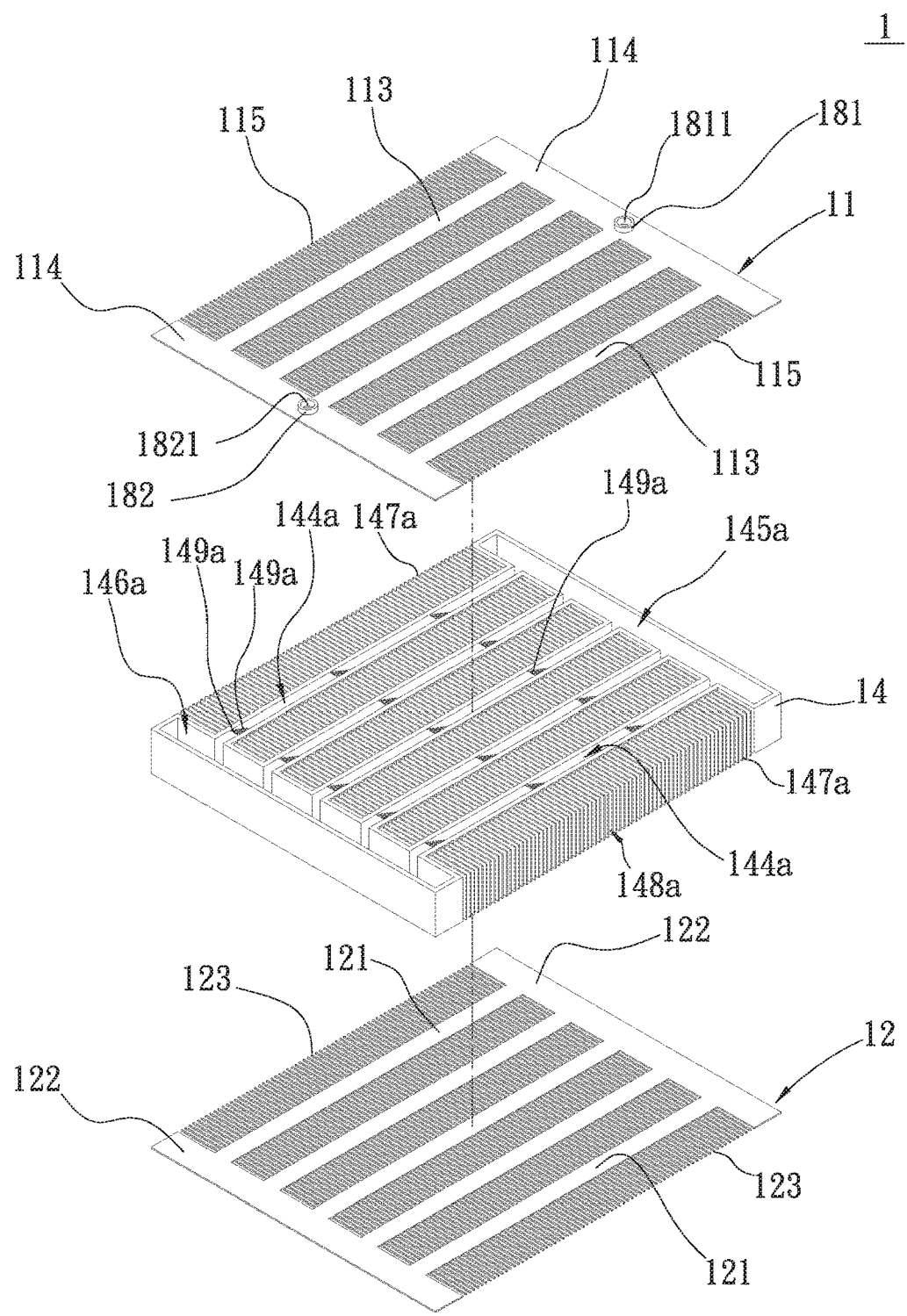
FIG. 10 is an exploded perspective view of the water-cooling radiator structure according to a fourth embodiment of the present invention, which uses the first radiator element of FIG. 9.
Figure 11:
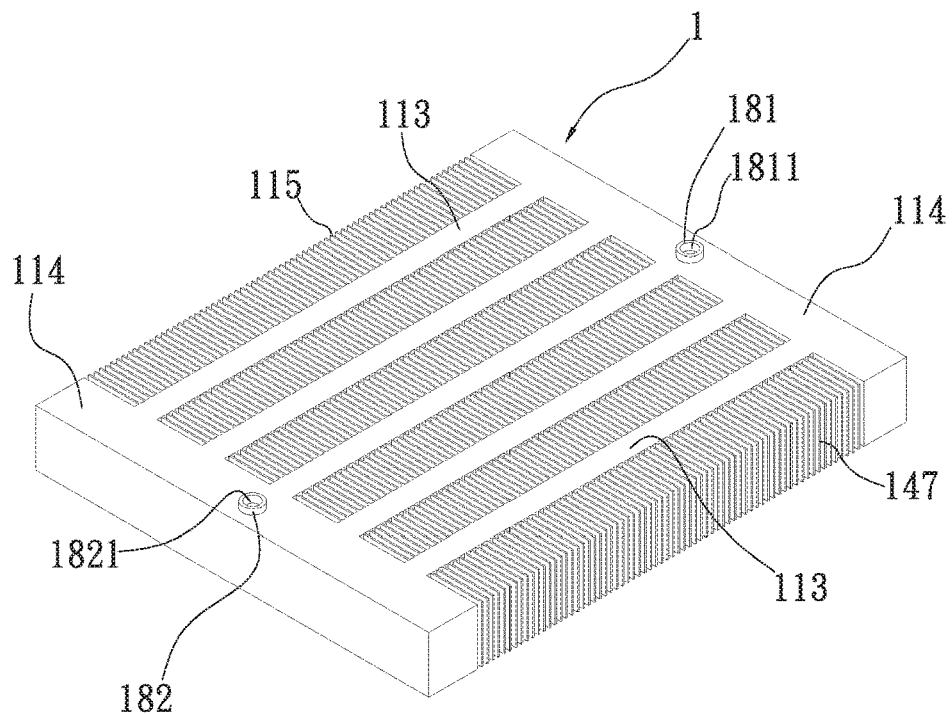
FIG. 11 is an assembled view of FIG. 10.

FIGS. 10 and 11 are exploded and assembled perspective views, respectively, of the water-cooling radiator structure 1 according to a fourth embodiment of the present invention; and FIG. 9 is a perspective view showing the first radiator element 14a in another configuration for use in the fourth embodiment. Please refer to FIGS. 10 and 11 along with FIG. 9. The water-cooling radiator structure 1 according to the fourth embodiment is different from the first embodiment in that the first radiator element 14a further has a first and a second communicating opening 141a, 142a as well as at least one connecting section 149a. More specifically, in the fourth embodiment, the first radiator elements 14a being stacked to form the first water-cooling radiator main body 14 respectively have a first communicating opening 141a, a second communicating opening 142a, at least one first coupling section 181, at least one second coupling section 182, at least one connecting section 149, a plurality of first fins 147a, and at least one first slot 143a. Since the first fins 147a in the fourth embodiment are generally structurally and functionally similar to those in the first embodiment, they are not repeatedly described herein. In the illustrated fourth embodiment, a plurality of straight elongated first slots 143a instead of one winding first slot 143a is formed on each first radiator element 14a. The first slots 143a and the first and second communicating openings 141a, 142a respectively penetrate the first radiator element 14a in a thickness direction thereof. Further, the first slots 143a are located and communicably extended between the first and the second communicating opening 141a, 142a. The first slots 143a of the stacked first radiator elements 14a together define at least one first flow passage 144a on the first water-cooling radiator main body 14, and the first and the second communicating openings 141a, 142a of the stacked first radiator elements 14a define a first and a second reservoir 145a, 146a, respectively, on the first water-cooling radiator main body 14. In the illustrated fourth embodiment, there are five straight elongated first flow passages 144a, one first reservoir 145a and one second reservoir 146a, as can be seen in FIG. 10. Also, in practical implementation of the fourth embodiment of the present invention, the design and the number of the first slots 143a can be adjusted according to actual need for heat dissipation and the space available, and each of the first slots 143a can be optionally a winding slot, a curved slot, or any other suitably shaped slot, such as a radial slot.

In the illustrated fourth embodiment, there are three connecting sections 149a, each of which is integrally connected to portions of the first radiator element 14a located adjacent to two opposite lateral sides of each first slot 143a. It is noted the connecting sections 149a are located atop the first slots 143a. The second sealing element 12, the first radiator elements 14a and the first sealing element 11 are sequentially stacked from bottom to top and then integrally connected together through heat treating to form the water-cooling radiator structure 1. More specifically, the first and the second sealing element 11, 12 are integrally connected at one side to an upper and a lower side of the first water-cooling radiator main body 14, respectively, to seal tops and bottoms of the first flow passages 144a as well as tops and bottoms of the first and second reservoirs 145a, 146a, respectively. With these arrangements, the first reservoir 145a is fluidly communicable with the second reservoir 146a via the first flow passages 144a. In the illustrated fourth embodiment, the number of the first flow passages 144a is not necessarily limited to five.

In the fourth embodiment, the first and the second coupling section 181, 182 can be optionally provided on the first sealing element 11 and have a first water-guiding hole 1811 and a second water-guiding hole 1821, respectively. In the illustrated fourth embodiment, there is one first water-guiding hole 1811 that is corresponding to and fluidly communicable with the first reservoir 145a and one second water-guiding hole 1821 that is corresponding to and fluidly communicable with the second reservoir 146a. Further, the first and the second water-guiding hole 1811, 1821 are used as a water inlet and a water outlet, respectively, in the fourth embodiment. That is, the first water-guiding hole 1811 is a water inlet for guiding a working fluid, such as pure water or other water-cooling liquid, into the first reservoir 145a to flow along the first flow passages 144a to the second reservoir 146a. The working fluid finally leaves the water-cooling radiator structure 1 via a water outlet, i.e. the second water-guiding hole 1821. In other operable embodiments, it is also possible to optionally provide the first coupling section 181 on one side of the first water-cooling radiator main body 14 located adjacent to the first reservoir 145a and the second coupling section 182 on another side of the first water-cooling radiator main body 14 located adjacent to the second reservoir 146a.

The first sealing element 11 of the fourth embodiment is different from that of the first embodiment in further having first reservoir sealing sections 114 and having the first and second coupling sections 181, 182 provided on the first reservoir sealing sections 114 instead of the first flow passage sealing section 113. That is, in the fourth embodiment, the first sealing element 11 has at least one first flow passage sealing section 113, a plurality of second fins 115, and two opposite first reservoir sealing sections 114. The first and the second coupling section 181, 182 are respectively arranged on one of the two first reservoir sealing sections 114, and every first flow passage sealing section 113 has two opposite ends integrally connected to the two first reservoir sealing sections 114. In the illustrated fourth embodiment, there is a plurality of first flow passage sealing sections 113, which are located and extended between the two first reservoir sealing sections 114 and are corresponding to the first flow passages 144a in shape and position. The first flow passage sealing sections 113 and the first reservoir sealing sections 114 have one side connected to the upper side of the first water-cooling radiator main body 14 to seal the tops of the first flow passages 144a and the tops of the first and second reservoirs 145a, 146a, respectively. The second fins 115 are outward extended from two opposite lateral sides of each of the first flow passage sealing sections 113 and are shaped and located corresponding to the first fins 147a.

The second sealing element 12 of the fourth embodiment is different from that of the first embodiment in further having second reservoir sealing sections 122. That is, in the fourth embodiment, the second sealing element 12 has at least one second flow passage sealing section 121, a plurality of third fins 123, and two opposite second reservoir sealing sections 122. Every second flow passage sealing section 121 has two opposite ends integrally connected to the two second reservoir sealing sections 122. In the illustrated fourth embodiment, there is a plurality of second flow passage sealing sections 121, which are located and extended between the two second reservoir sealing sections 122 and are corresponding to the first flow passages 144a in shape and position. The second flow passage sealing sections 121 and the second reservoir sealing sections 122 have one side connected to the lower side of the first water-cooling radiator main body 14 to seal the bottoms of the first flow passages 144a and the bottoms of the first and second reservoirs 145a, 146a. The third fins 123 are outward extended from two opposite lateral sides of each of the second flow passage sealing sections 121 and are shaped and located corresponding to the first fins 147a. The second and third fins 115, 123 are used to dissipate absorbed heat into ambient environment.

In practical implementation of the fourth embodiment of the present invention, the first and the second coupling section 181, 182 can be connected in a fluid communicable manner to an outlet and an inlet, respectively, of a water block (not shown) via two tubes (not shown). The water block has one side serving as a heat-absorbing surface for contacting with a heat-producing element, such as a central processing unit (CPU) or a graphic processing unit (GPU), to absorb the produced heat. A working fluid in the water block absorbs the heat produced by the heat-producing element and absorbed by the heat-absorbing surface of the water block, and the heat-carrying working fluid is driven by a pump inside the water block to flow through the first water-guiding hole 1811 into the first reservoir 145a on the first water-cooling radiator main body 14. While the working fluid flows through the first flow passages 144a, the heat absorbed by the working fluid is transferred to the first, second and third fins 147a, 115, 123, from where the heat is dissipated into ambient environment by way of radiation. The working fluid is accordingly cooled and leaves the water-cooling radiator structure 1 via the second water-guiding hole 1821 of the second coupling section 182 to flow back into the water block. The working fluid continuously circulates between the water block and the water-cooling radiator structure 1 to achieve the heat dissipation effect via water cooling.

Figure 12:
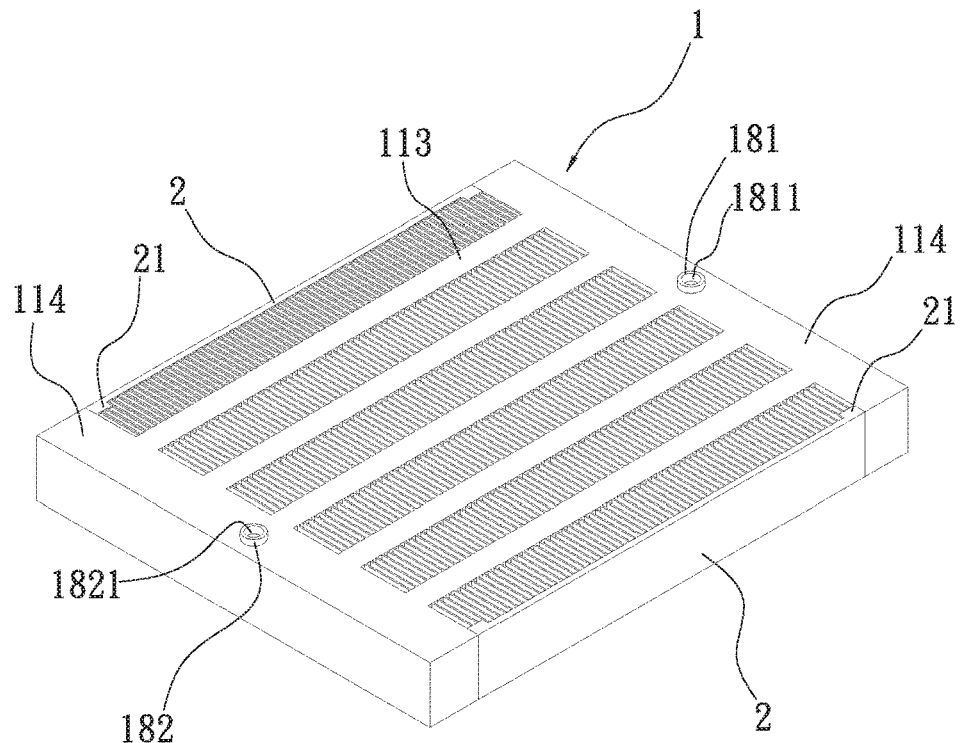
FIG. 12 is an assembled perspective view of a variant of the water-cooling radiator structure according to the fourth embodiment of the present invention.

According to a variant of the fourth embodiment shown in FIG. 12, the water-cooling radiator structure 1 further includes two casings 2 located at two opposite lateral sides of the water-cooling radiator structure 1. The casings 2 respectively have a plurality of retaining sections 21, which are outward extended from one side of the casings 2 to abut on outer surfaces of the first and the second sealing element 11, 12. Therefore, the whole water-cooling radiator structure 1 with the casings 2 has increased structural strength and is effectively protected against damages.

According to another variant of the fourth embodiment, the water-cooling radiator structure 1 has a fan (not shown) connected thereto. More specifically, the fan is connected to a top of the water-cooling radiator structure 1 to create forced dissipation of heat from the water-cooling radiator structure 1.

By forming the first slot 143a and the first fins 147a on every first radiator element 14a and forming the second and third fins 115, 123 on the first and second sealing elements 11, 12, respectively, it is possible for the heat carried by the working fluid to be transferred from each of the first radiator elements 14a directly to the first fins 147a thereof and from the first and second sealing elements 11, 12 directly to the second and third fins 115, 123 thereof. With these arrangements, largely increased heat transfer efficiency and excellent cooling efficiency can be effectively achieved. Further, by stacking the first and second sealing elements 11, 12 and the first radiator elements 14a into an integral water-cooling radiator structure 1, the water-cooling radiator structure 1 so obtained can have improved structural strength and heat dissipation effect.

Figure 13:
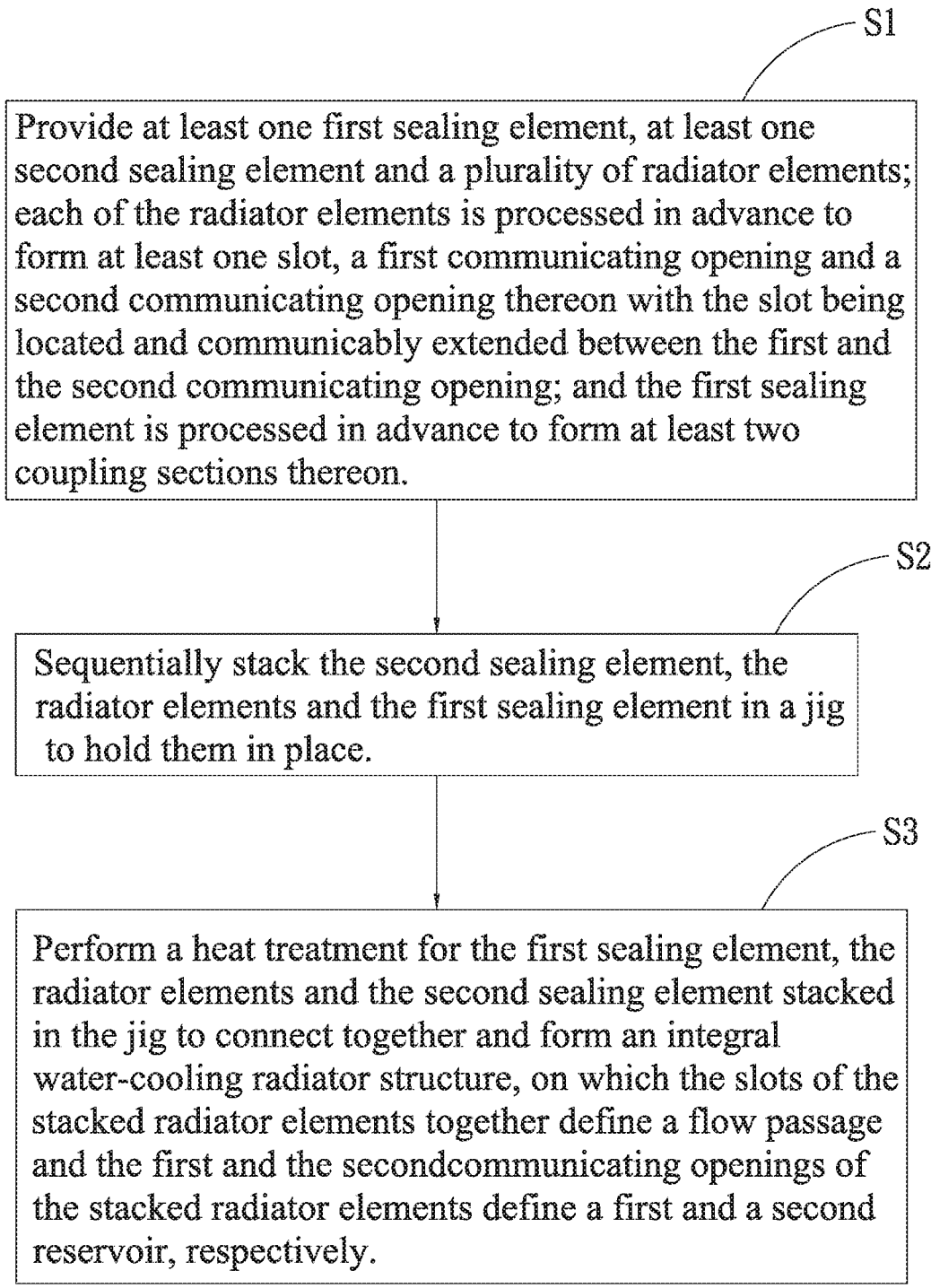
FIG. 13 is a flowchart showing the steps included in a water-cooling radiator structure manufacturing method according to a fifth embodiment of the present invention.

FIG. 13 is a flowchart showing the steps included in a water-cooling radiator structure manufacturing method according to a fifth embodiment of the present invention. Please refer to FIG. 13 along with FIGS. 10 and 11. More specifically, the illustrated fifth embodiment involves a method of manufacturing the water-cooling radiator structure 1 according to the fourth embodiment of the present invention. The following is a description of the steps included in the method according to the fifth embodiment of the present invention.

A first step (S1) of the method in the fifth embodiment is generally similar to the first step (S1) of the method in the second embodiment. Therefore, portions of the step (S1) in the fifth embodiment that are the same as the step (S1) in the second embodiment are not repeatedly described herein. The step (S1) of the fifth embodiment is different from that of the second embodiment in that each of the radiator elements is processed in advance to further form a first and a second communicating opening 141a, 142a thereon, such that the slot is located and communicably extended between the first and the second communicating opening. In the illustrated fifth embodiment, each of the radiator elements is processed in advance to form a plurality of straight elongated slots, such as the first slots 143a in the fourth embodiment. The straight and elongated slots as well as the first and second communicating openings 141a, 142a respectively penetrate the radiator element, such as the first radiator element 14a, in a thickness direction thereof. Further, the straight and elongated slots are located and communicably extended between the first and the second communicating opening 141a, 142a.

A second step (S2) of the method in the fifth embodiment is substantially the same as the second step (S2) of the method in the second embodiment. Therefore, the step (S2) in the fifth embodiment is not repeatedly described herein.

A third step (S3) of the method in the fifth embodiment is generally similar to the third step (S3) of the method in the second embodiment. Therefore, portions of the step (S3) in the fifth embodiment that are the same as the step (S3) in the second embodiment are not repeatedly described herein. The step (S3) of the fifth embodiment is different from that of the second embodiment in that the first and the second communicating openings of the stacked radiator elements define a first and a second reservoir, respectively, on the first water-cooling radiator main body; and the first and the second reservoir are respectively communicable with one of the two coupling sections. In the illustrated fifth embodiment, the straight elongated slots of the stacked radiator elements together define a plurality of straight elongated flow passages, such as the first flow passages 144a in the fourth embodiment, on the water-cooling radiator main body; and the first and the second communicating openings 141a, 142a of the stacked radiator elements define the first and the second reservoir 145a, 146a, respectively, on the first water-cooling radiator main body 14, as can be seen in FIG. 10; and the first and the second reservoir 145a, 146a are respectively communicable with one of the two coupling sections, i.e. one of the first and the second coupling section 181, 182, so that the second reservoir 146a is fluidly communicable with the first reservoir 145a via the plurality of straight and elongated flow passages.

Therefore, the water-cooling radiator structure 1 manufactured with the method according to the fifth embodiment of the present invention has the advantages of improved heat transfer efficiency and heat dissipation effect, effectively increased structural strength, and changeable flow passage designs that meet different heat dissipation requirements.

Figure 14:
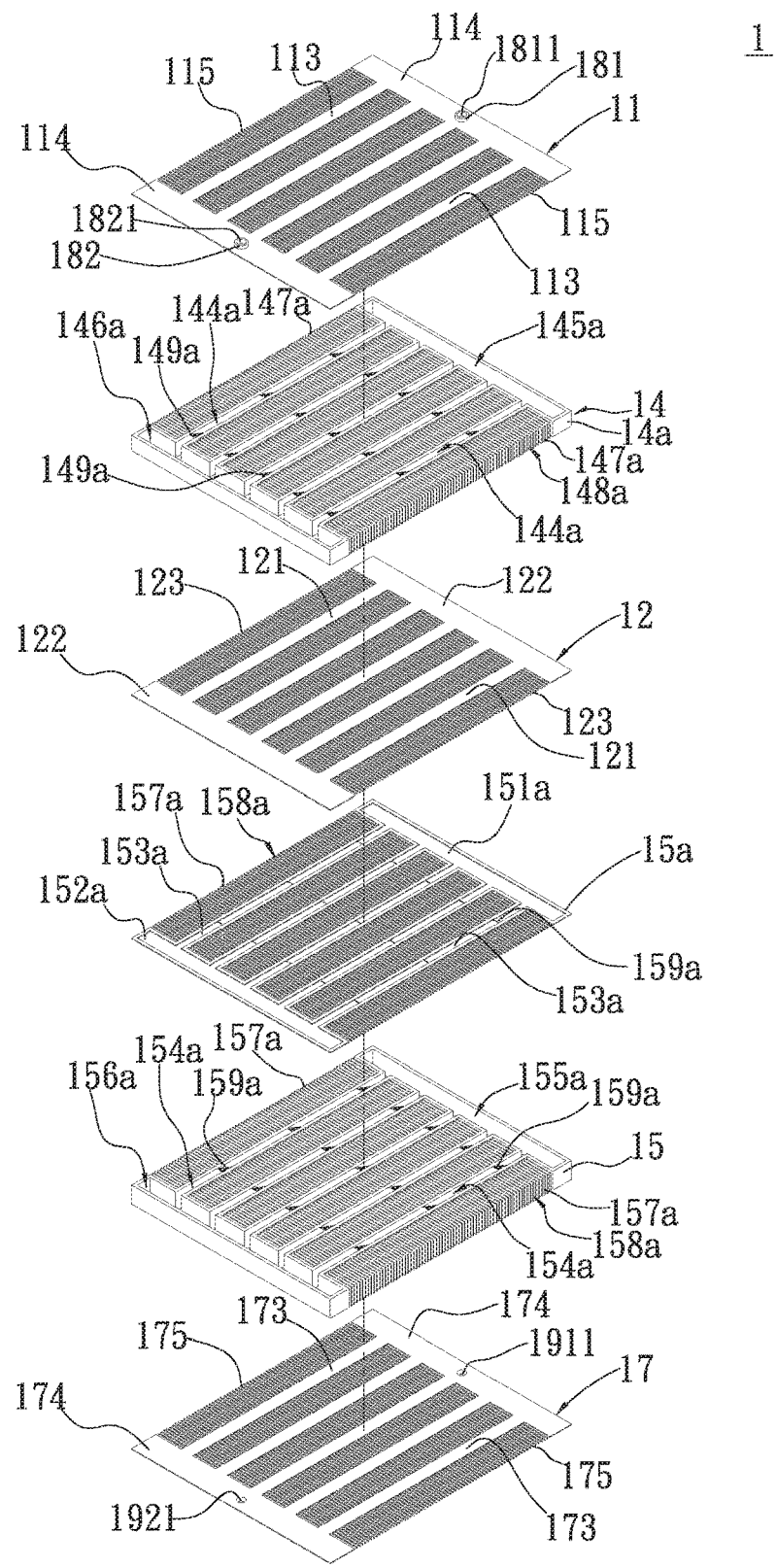
FIG. 14 is an exploded perspective view of the water-cooling radiator structure according to a sixth embodiment of the present invention.
Figure 15:
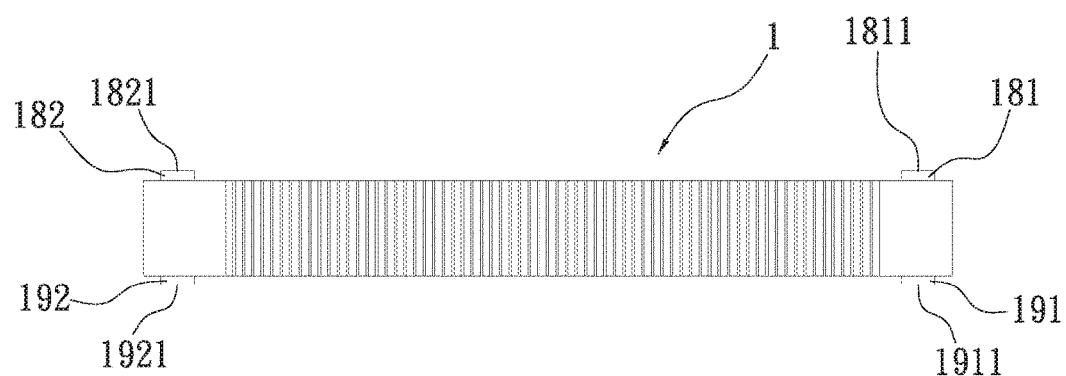
FIG. 15 an assembled side view of the water-cooling radiator structure according to the sixth embodiment of the present invention.

FIGS. 14 and 15 are exploded perspective view and assembled side view, respectively, of the water-cooling radiator structure 1 according to a sixth embodiment of the present invention. Please refer to FIGS. 14 and 15 along with FIG. 9. Since the water-cooling radiator structure 1 according to the sixth embodiment is generally structurally and functionally similar to the fourth embodiment, the parts of the sixth embodiment that are the same as the fourth embodiment are not repeatedly described herein. The sixth embodiment is different from the fourth one in further including a plurality of second radiator elements 15a, at least one third coupling section 191, at least one fourth coupling section 192, and at least one third sealing element 17. In the illustrated sixth embodiment, the second radiator elements 15a are sheet members made of a metal material, such as copper, aluminum, stainless steel, magnesium-aluminum alloy or titanium, and are stacked between the second sealing element 12 and the third sealing element 17 to form a second water-cooling radiator main body 15. Each of the second radiator elements 15a includes at least one second slot 153a, a third communicating opening 151a, a plurality of first radiating fins 157a, at least one connecting section 159a, and a fourth communicating opening 152a. The first radiating fins 157a are outward extended from portions of the second radiator element 15a located adjacent to two opposite lateral sides of the second slot 153a for dissipating absorbed heat into ambient environment. A heat-dissipating opening 158a is formed between any two adjacent first radiating fins 157a. The heat-dissipating openings 158a allow external air to flow therethrough and accordingly, enable quick heat exchange between the external air and the first radiating fins 157a. In the illustrated sixth embodiment, there is a plurality of straight elongated second slots 153a formed on each of the second radiator elements 15a. The second slots 153a and the third and fourth communicating openings 151a, 152a respectively penetrate the second radiator element 15a in a thickness direction thereof. Further, the second slots 153a are located and communicably extended between the third and the fourth communicating opening 151a, 152a. The second slots 153a of the stacked second radiator elements 15a together define at least one second flow passage 154a on the second water-cooling radiator main body 15, and the third and the fourth communicating openings 151a, 152a of the stacked second radiator elements 15a define a third and a fourth reservoir 155a, 156a, respectively, on the second water-cooling radiator main body 15. In the illustrated sixth embodiment, there are a plurality of straight elongated second flow passages 154a, one third reservoir 155a and one fourth reservoir 156a. Also, in practical implementation of the sixth embodiment of the present invention, the design and the number of the second slots 153a can be adjusted according to actual need for heat dissipation and the space available, and each of the second slots 153a can be optionally a winding slot, a curved slot, or any other suitably shaped slot, such as a radial slot.

In the illustrated sixth embodiment, there is a plurality of connecting sections 159a, each of which is integrally connected to portions of the second radiator element 15a located adjacent to two opposite lateral sides of each second slot 153a. It is noted the connecting sections 159a are located atop the second slots 153a. The third sealing element 17, the second radiator elements 15a, the second sealing element 12, the first radiator elements 14a and the first sealing element 11 are sequentially stacked from bottom to top and then integrally connected together through heat treating to form the water-cooling radiator structure 1. More specifically, the second sealing element 12 has another side and the third sealing element has one side integrally connected to an upper and a lower side, respectively, of the second water-cooling radiator main body 15 to seal tops and bottoms, respectively, of the second flow passages 154a and the third and fourth reservoirs 155a, 156a. With these arrangements, the third reservoir 155a is fluidly communicable with the fourth reservoir 156a via the second flow passages 154a.

In other operable embodiments, it is also possible to form only one second flow passage 154a on the second radiator main body 15. The number of the second flow passages 154a is defined by the number of the second slots 153a formed on each of the second radiator elements 15a.

In the sixth embodiment, the third and the fourth coupling section 191, 192 are provided on the third sealing element 17 and respectively have a third water-guiding hole 1911 and a fourth water-guiding hole 1921, which extend through the third coupling section 191 and the fourth coupling section 192, respectively. In the illustrated sixth embodiment, there is one third water-guiding hole 1911 that is corresponding to and fluidly communicable with the third reservoir 155a and one second water-guiding hole 1921 that is corresponding to and fluidly communicable with the fourth reservoir 156a. Further, the third and the fourth water-guiding hole 1911, 1921 are used as a water inlet and a water outlet, respectively, in the sixth embodiment. That is, the third water-guiding hole 1911 is a water inlet for guiding a working fluid, such as pure water or other water-cooling liquid, into the third reservoir 155a to flow along the second flow passages 154a to the fourth reservoir 156a. The working fluid finally leaves the water-cooling radiator structure 1 via a water outlet, i.e. the fourth water-guiding hole 1921. In other operable embodiments, it is also possible to optionally provide the third coupling section 191 on one side of the second water-cooling radiator main body 15 located adjacent to the third reservoir 155a and the fourth coupling section 192 on another side of the second water-cooling radiator main body 15 located adjacent to the fourth reservoir 156a.

In the illustrated sixth embodiment, the third sealing element 17 is a sheet member made of a metal material, such as copper, aluminum, stainless steel, magnesium-aluminum alloy or titanium. The third sealing element 17 has at least one flow passage sealing section 173, a plurality of second radiating fins 175, and two opposite reservoir sealing sections 174. The third and the fourth coupling section 191, 192 are respectively arranged on one of the two reservoir sealing sections 174, and every flow passage sealing section 173 has two opposite ends integrally connected to the two reservoir sealing sections 174. In the illustrated sixth embodiment, there is a plurality of flow passage sealing sections 173, which are located and extended between the two reservoir sealing sections 174 and are corresponding to the second flow passages 154a in shape and position. The flow passage sealing sections 173 and the reservoir sealing sections 174 have one side connected to the lower side of the second water-cooling radiator main body 15 to seal the bottoms of the second flow passages 154a and the bottoms of the third and fourth reservoirs 155a, 156a. The second flow passages 154a as well as the third and fourth reservoirs 155a, 156a are isolated from the first flow passages 144a as well as the first and second reservoirs 145a, 146a, respectively, by the second sealing element 12, and are accordingly, not fluidly communicable with the first flow passages 144a as well as the first and second reservoirs 145a, 146a. The second radiating fins 175 are outward extended from two opposite lateral sides of each of the flow passage sealing sections 173 and are shaped and located corresponding to the first radiating fins 157a.

In practical implementation of the sixth embodiment of the present invention, the first and the second coupling section 181, 182 on the first sealing element 11 can be connected in a fluid communicable manner to an outlet and an inlet, respectively, of a water block (not shown) via two tubes (not shown); and the third and the fourth coupling section 191, 192 on the third sealing element 17 can be connected in a fluid communicable manner to another outlet and another inlet, respectively, of the same water block via another two tubes (not shown). The water block has one side serving as a heat-absorbing surface for contacting with a heat-producing element, such as a central processing unit (CPU) or a graphic processing unit (GPU), to absorb the produced heat. A working fluid in the water block absorbs the heat produced by the heat-producing element and absorbed by the heat-absorbing surface of the water block. The heat-carrying working fluid is driven by a pump inside the water block to flow through the first water-guiding hole 1811 into the first reservoir 145a on the first water-cooling radiator main body 14 and through the third water-guiding hole 1911 into the third reservoir 155a on the second water-cooling radiator main body 15. Then, when the working fluid flows from the first reservoir 145a through the first flow passages 144a, the heat carried by the working fluid is transferred to the first, second and third fins 147a, 115, 123, from where the heat is dissipated into ambient environment by way of radiation. Meanwhile, when the working fluid also flows from the third reservoir 155a through the second flow passages 154a, the heat carried by the working fluid is transferred to the third fins 123 as well as the first and second radiating fins 157a, 175, from where the heat is dissipated into ambient environment by way of radiation. The working fluid is accordingly cooled and leaves the water-cooling radiator structure 1 via the second water-guiding hole 1821 and the fourth water-guiding hole 1921 to flow back into the water block. The working fluid continuously circulates between the water block and the water-cooling radiator structure 1 to achieve the heat dissipation effect via water cooling. With the above arrangements, the water-cooling radiator structure 1 of the present invention can be used with a water block having two inlets and two outlets to effectively double the water cooling effect.

In practical implementation of the present invention, the water-cooling radiator structure 1 is not necessarily used with a water block having two inlets and two outlets. That is, the water-cooling radiator structure 1 of the present invention can be used with more than one water block, depending on the actual need for heat dissipation and the number of heat-producing elements, which can be a CPU and other processing units. More specifically, the first and second coupling sections 181, 182 can be connected to a first water block while the third and fourth coupling sections 191, 192 can be connected to a second water block. With this arrangement, the two water blocks can be separately used to absorb heat produced by two heat-producing elements.

Therefore, by stacking the first, second and third sealing elements 11, 12, 17 as well as the first and second radiator elements 14a, 15a to form an integral water-cooling radiator structure 1 of the present invention, the whole water-cooling radiator structure can have effectively increased structural strength and improved heat transfer efficiency.

Figure 16:
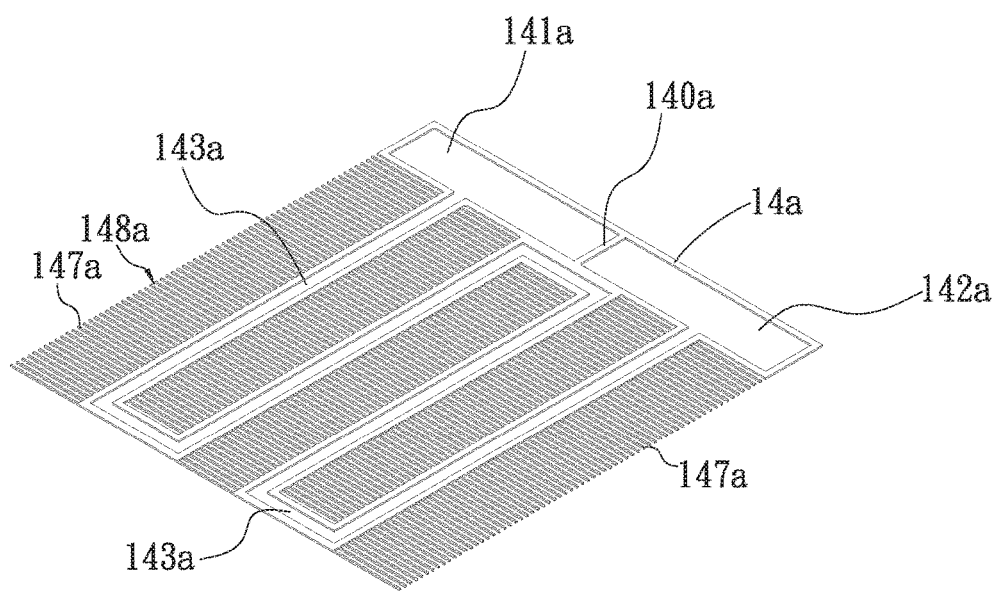
FIG. 16 is a perspective view of the first radiator element in still another configuration.
Figure 17:
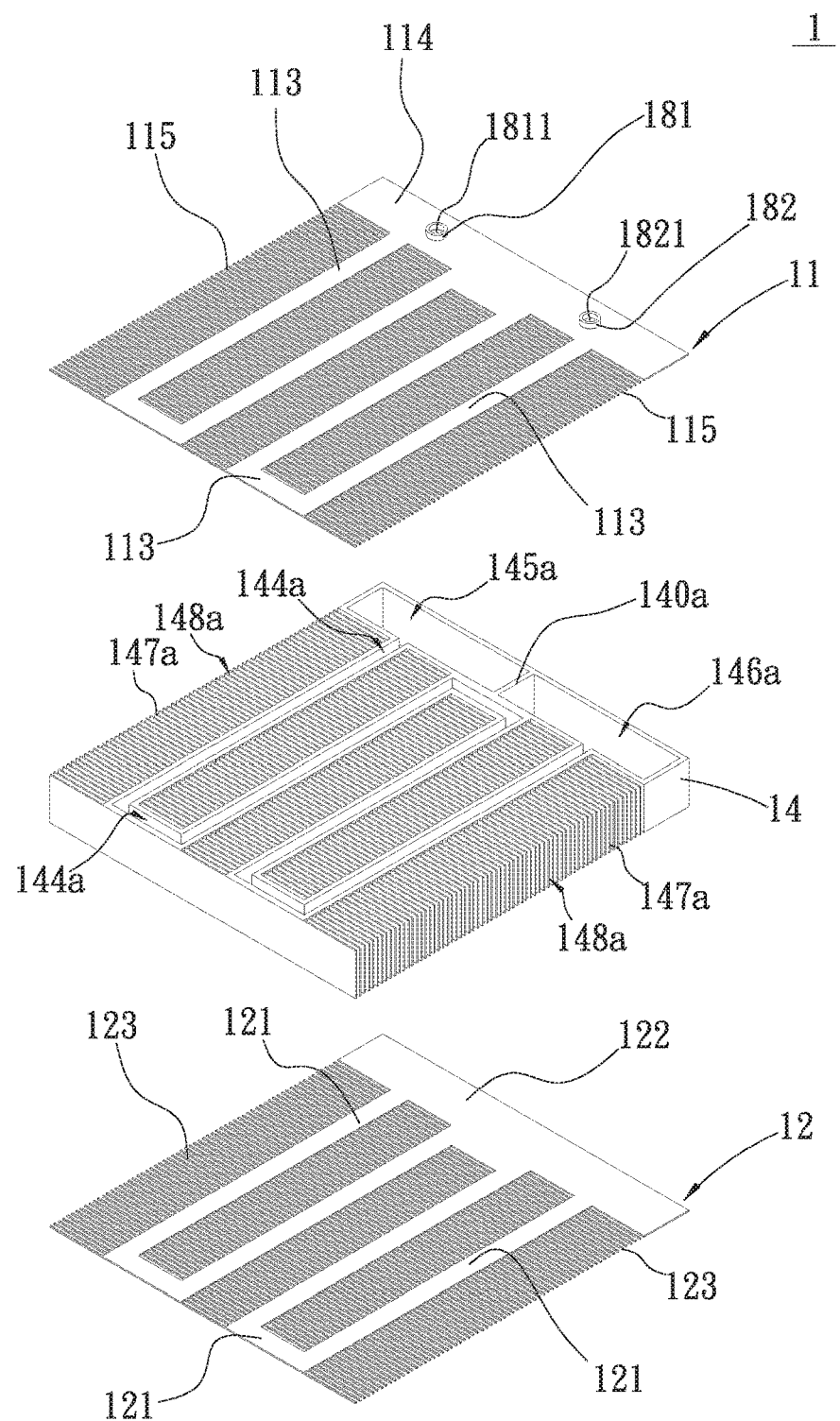
FIG. 17 is an exploded perspective view of the water-cooling radiator structure according to a seventh embodiment of the present invention, which uses the first radiator element of FIG. 16.
Figure 18:
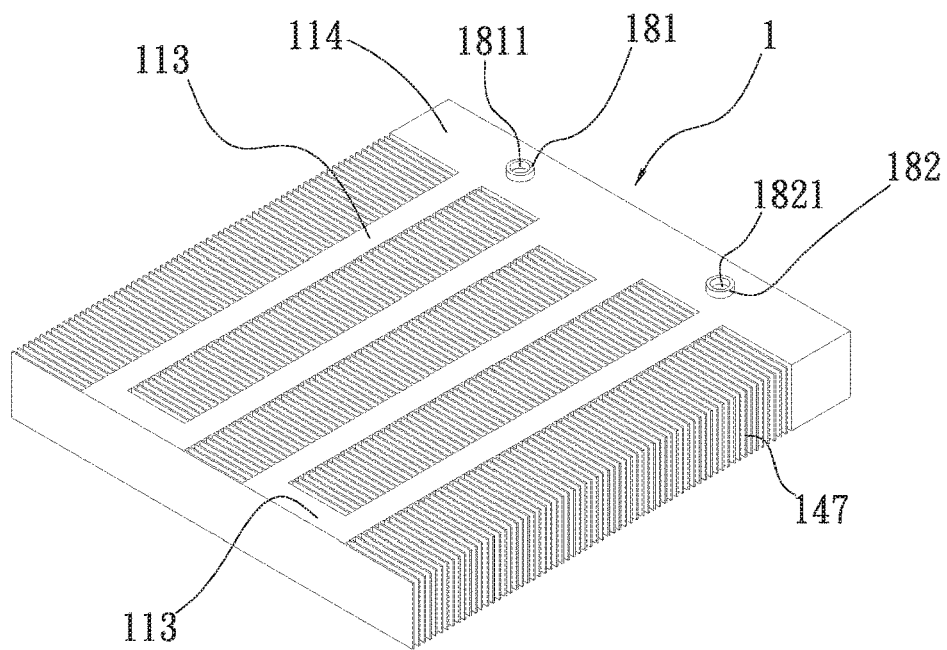
FIG. 18 is an assembled view of FIG. 17.
Figure 19:
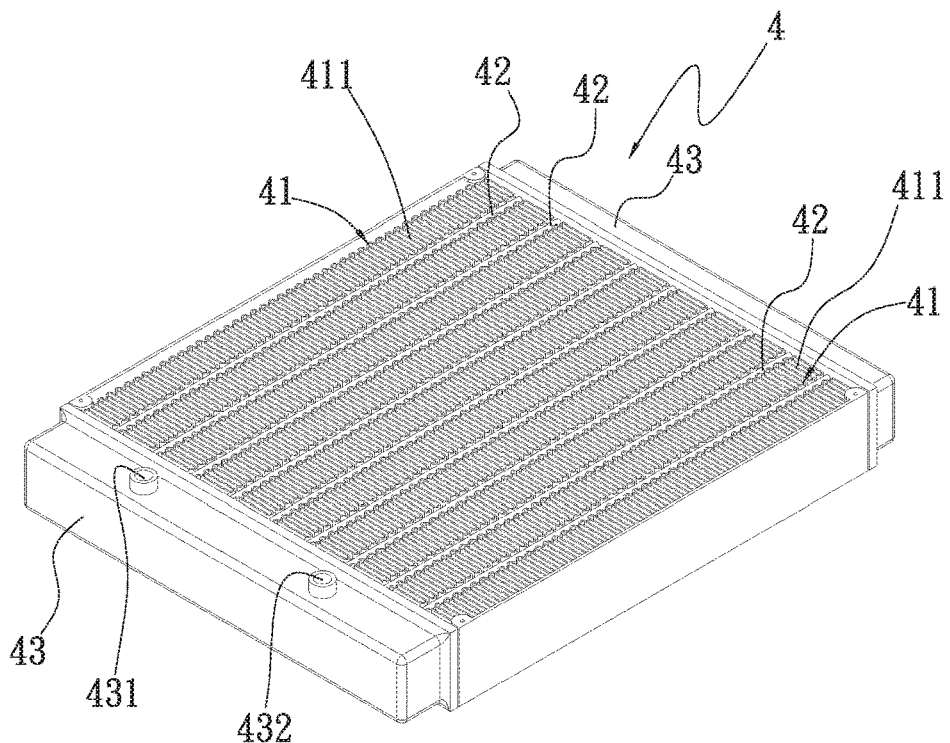
FIG. 19 is an assembled perspective view of a conventional water-cooling radiator.

FIGS. 17 and 18 are exploded and assembled perspective views, respectively, of the water-cooling radiator structure 1 according to a seventh embodiment of the present invention. Please refer to FIGS. 17 and 18 along with FIG. 16, which is a perspective view of the first radiator element 14a in still another configuration for use in the seventh embodiment. Since the water-cooling radiator structure 1 according to the seventh embodiment is generally structurally and functionally similar to the first embodiment, the parts of the seventh embodiment that are the same as the first embodiment are not repeatedly described herein. The seventh embodiment is different from the first one in that the first radiator element 14a further has a first and a second communicating opening 141a, 142a. More specifically, in the seventh embodiment, the first radiator elements 14a being stacked to form the first water-cooling radiator main body 14 respectively have a first communicating opening 141a, a second communicating opening 142a, a plurality of first fins 147a, and at least one first slot 143a. The first slot 143a and the first and second communicating openings 141a, 142a respectively penetrate the first radiator element 14a in a thickness direction thereof. Further, as shown in FIG. 16, the first and the second communicating opening 141a, 142a in the seventh embodiment are formed on a right half of the first radiator element 14a and are located side by side, while the first slot 143a is formed on a left half of the first radiator element 14a. As can be seen in FIG. 17, the first and the second communicating openings 141a, 142a of the stacked first radiator elements 14a define a first reservoir 145a and a second reservoir 146a, respectively, and the first slots 143a of the stacked first radiator elements 14a together define a first flow passage 144a. However, it is understood the above arrangements are only illustrative and not intended to limit the present invention in any way. Further, unlike the first embodiment, the winding first slot 143a in the seventh embodiment has an end, which is a front end, connected in a fluid communicable manner to the first communicating opening 141a, and another end, which is a rear end, connected in a fluid communicable manner to the second communicating opening 142a.

There is a partitioning section 140a provided on the first radiator element 14a between the first and the second communicating opening 141a, 142a. The partitioning section 140a is located at a joint between the first and the second communicating opening 141a, 142a to separate and prevent them from directly communicating with each other. More specifically, the first and the second communicating opening 141a, 142a are indirectly communicable with each other via the first slot 143a. Since the first fins 147a of the seventh embodiment are generally structurally and functionally similar to those of the first embodiment, they are not repeatedly described herein. The second sealing element 12, the first radiator elements 14a and the first sealing element 11 are sequentially stacked from bottom to top and then integrally connected together through heat treating to form the water-cooling radiator structure 1. More specifically, the first and the second sealing element 11, 12 are respectively integrally connected at one side to an upper and a lower side of the first water-cooling radiator main body 14 to seal a top and a bottom of the first flow passage 144a as well as tops and bottoms of the first and second reservoirs 145a, 146a. Further, the first reservoir 145a is communicable with the second reservoir 146a via the first flow passage 144a.

In the illustrated seventh embodiment, the first and the second coupling section 181, 182 can be optionally provided on the first sealing element 11. The first and the second coupling section 181, 182 respectively have a first water-guiding hole 1811 and a second water-guiding hole 1821. In the illustrated seventh embodiment, the first water-guiding hole 1811 is located corresponding to and communicates with the first reservoir 145a and the second water-guiding hole 1821 is located corresponding to and communicates with the second reservoir 146a. Further, the first and the second water-guiding hole 1811, 1821 are respectively used as a water inlet and a water outlet. That is, the first water-guiding hole 1811 is a water inlet for guiding a working fluid, such as pure water or other water-cooling liquid, into the first reservoir 145a. The working fluid then flows from the first reservoir 145a along the first flow passage 144a into the second reservoir 146a and finally leaves the water-cooling radiator structure 1 via a water outlet, i.e. the second water-guiding hole 182. In other operable embodiments, it is also possible to optionally provide the first coupling section 181 on a portion of the first water-cooling radiator main body 14 located adjacent to the first reservoir 145a and the second coupling section 182 on another portion of the first water-cooling radiator main body 14 located adjacent to the second reservoir 146a.

The first sealing element 11 of the seventh embodiment is different from that of the first embodiment in further having a first reservoir sealing section 114 and having the first and second coupling sections 181, 182 provided on the first reservoir sealing section 114 instead of the first flow passage sealing section 113. That is, in the seventh embodiment, the first sealing element 11 has at least one first flow passage sealing section 113, a plurality of second fins 115, and a first reservoir sealing section 114. In the illustrated seventh embodiment, the first reservoir sealing section 114 is formed on a right half of the first sealing element 11 and located corresponding to the first and second reservoirs 145a, 146a; and the first and the second coupling section 181, 182 are arranged on the first reservoir sealing section 114. In the illustrated seventh embodiment, the first flow passage sealing section 113 is formed on a left half of the first sealing element 11 and is corresponding to the first flow passage 144a in shape and position. The first flow passage sealing section 113 has two opposite ends integrally connected to the first reservoir sealing section 114. The first flow passage sealing section 113 and the first reservoir sealing section 114 respectively have one side connected to the upper side of the first water-cooling radiator main body 14, so that the first flow passage sealing section 113 seals the top of the first flow passage 144a and the first reservoir sealing section 114 seals the tops of the first and second reservoirs 145a, 146a. The second fins 115 are outward extended from two opposite lateral sides of the first flow passage sealing section 113 and are shaped and located corresponding to the first fins 147a.

The second sealing element 12 of the seventh embodiment is different from that of the first embodiment in further having a second reservoir sealing section 122. That is, in the seventh embodiment, the second sealing element 12 has at least one second flow passage sealing section 121, a plurality of third fins 123, and a second reservoir sealing section 122. In the illustrated seventh embodiment, the second reservoir sealing section 122 is formed on a right half of the second sealing element 12 and located corresponding to the first and second reservoirs 145*a*, 146*a*; and the second flow passage sealing section 121 is formed on a left half of the second sealing element 12 and is corresponding to the first flow passage 144*a* in shape and position. The second flow passage sealing section 121 has two opposite ends integrally connected to the second reservoir sealing section 122. The second flow passage sealing section 121 and the second reservoir sealing section 122 respectively have one side connected to the lower side of the first water-cooling radiator main body 14, so that the second flow passage sealing section 121 seals the bottom of the first flow passage 144*a* and the second reservoir sealing section 122 seals the bottoms of the first and second reservoirs 145*a*, 146*a*. The third fins 123 are outward extended from two opposite lateral sides of the second flow passage sealing section 121 and are shaped and located corresponding to the first fins 147*a*. The second and third fins 115, 123 are used to dissipate absorbed heat into ambient environment. With the above arrangements, the water-cooling radiator structure 1 according to the seventh embodiment of the present invention can effectively achieve improved cooling effect.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water-cooling radiator structure, comprising a first sealing element, a second sealing element, and a plurality of first radiator elements; the first radiator elements being stacked to form a first water-cooling radiator main body; each of the first radiator elements having a serpentine first slot defining a plurality of connected parallel segments, each serpentine first slot penetrates the first radiator elements in an entire thickness direction thereof, and the serpentine first slots of the stacked first radiator elements together defining a serpentine first flow passage on the first water-cooling radiator main body; the first and the second sealing elements each having one side connected to an upper and a lower side of the first water-cooling radiator main body, respectively, to seal a top and a bottom of the serpentine first flow passage, respectively; a first coupling section protruded and formed on the first sealing element at a first end of the serpentine first flow passage, and a second coupling section protruded and formed on the first sealing element at a second end of the serpentine first flow passage; and the first and the second coupling sections being fluidly communicable with the serpentine first flow passage, wherein each of the first radiator elements has a plurality of first fins; and the first fins being outward extended from portions of the first radiator element located adjacent to two opposite lateral sides of each parallel segment of the serpentine first slot with an opening being formed between any two adjacent first fins.

2. The water-cooling radiator structure as claimed in claim 1, wherein the first and the second coupling sections are provided on the first sealing element and define a first and a second water-guiding hole, respectively; the first and the second water-guiding holes extending through the first and the second coupling sections, respectively, and being fluidly communicable with the first and the second ends of the serpentine first flow passage, respectively.

3. The water-cooling radiator structure as claimed in claim 1, wherein the first sealing element has a first flow passage sealing section and a plurality of second fins; the first flow passage sealing section being connected at one side to the upper side of the first water-cooling radiator main body to seal the top of the serpentine first flow passage; the first and the second coupling sections being provided on the first flow passage sealing section and located corresponding to a front and a rear end, respectively, of the first flow passage sealing section; and the second fins being outward extended from two opposite lateral sides of the first flow passage sealing section.

4. The water-cooling radiator structure as claimed in claim 3, wherein the second sealing element has a second flow passage sealing section and a plurality of third fins; the second flow passage sealing section being connected at one side to the lower side of the first water-cooling radiator main body to seal the bottom of the serpentine first flow passage; and the third fins being outward extended from two opposite lateral sides of the second flow passage sealing section.

5. The water-cooling radiator structure as claimed in claim 1, wherein the first and the second sealing elements are sheet members made of a metal material, and the first radiator elements are sheet members made of a metal material; and the second sealing element, the first radiator elements and the first sealing element being sequentially stacked from bottom to top and then integrally connected together through heat treating to form the water-cooling radiator structure.

6. The water-cooling radiator structure as claimed in claim 1, further comprising a plurality of second radiator elements, a third coupling section, a fourth coupling section, and a third sealing element; the second radiator elements being stacked between the second and the third sealing elements to form a second water-cooling radiator main body; each of the second radiator elements having a second slot, which penetrates the second radiator elements in a thickness direction thereof, and the second slots of the stacked second radiator elements together defining a second flow passage on the second water-cooling radiator main body; the second sealing element having another side and the third sealing element having one side being connected to an upper and a lower side of the second water-cooling radiator main body, respectively, to seal a top and a bottom of the second flow passage, respectively; the third coupling element provided on the third sealing element at a first end of the second flow passage, and the fourth coupling element provided on the third sealing element at a second end of the second flow passage; and the third and the fourth coupling sections being fluidly communicable with the second flow passage.

7. The water-cooling radiator structure as claimed in claim 6, wherein the third and the fourth coupling sections are provided on the third sealing element and define a third and a fourth water-guiding hole, respectively; the third and the fourth water-guiding holes extending through the third and the fourth coupling sections, respectively, and being fluidly communicable with the first and the second end of the second flow passage, respectively.

8. The water-cooling radiator structure as claimed in claim 7, wherein each of the second radiator elements has a plurality of first radiating fins; and the first radiating fins being outward extended from portions of the second radiator element located adjacent to two opposite lateral sides of the second slot with a heat-dissipating opening being formed between any two adjacent first radiating fins.

9. The water-cooling radiator structure as claimed in claim 8, wherein the third sealing element has a flow passage sealing section and a plurality of second radiating fins; the flow passage sealing section being connected at one side to the lower side of the second water-cooling radiator main body to seal the bottom of the second flow passage; the third and the fourth coupling sections being provided on the flow passage sealing section and located corresponding to a front and a rear end, respectively, of the flow passage sealing section; and the second radiating fins being outward extended from two opposite lateral sides of the flow passage sealing section.

10. A water-cooling radiator structure, comprising a first sealing element, a second sealing element, and a plurality of first radiator elements; the first radiator elements being stacked to form a first water-cooling radiator main body; each of the first radiator elements having a first communicating opening, a second communicating opening, and a plurality of first slots fluidly communicable with the first and second communicating openings; the plurality of first slots as well as the first and second communicating openings penetrating the first radiator elements in an entire thickness direction thereof; the first and second communication openings being horizontally provided at two opposite sides of the plurality of first slots respectively and fluidly communicable with the plurality of first slots; the first slots of the stacked first radiator elements together defining a plurality of first flow passages on the first water-cooling radiator main body, and the first and the second communicating openings of the stacked first radiator elements defining a first reservoir and a second reservoir, respectively, on the first water-cooling radiator main body; the first and second reservoirs being provided at the two opposite sides of the first flow passages respectively and fluidly communicable with the first flow passages; the first and the second sealing elements each having one side connected to an upper and a lower side of the first water-cooling radiator main body, respectively, to seal tops and bottoms, respectively, of the first flow passages, the first reservoir and the second reservoir; the first reservoir being fluidly communicable with the second reservoir via the first flow passages; a first coupling section protruded and formed on the first sealing element on one side of the first water-cooling radiator main body located adjacent to the first reservoir, and a second coupling section protruded and formed on the first sealing element on another side of the first water-cooling radiator main body located adjacent to the second reservoir; and the first and the second coupling sections being fluidly communicable with the first and the second reservoirs, respectively.

11. The water-cooling radiator structure as claimed in claim 10, wherein the first slot on each of the first radiator elements is located and communicably extended between the first and the second communicating openings and each of the first radiator elements has a plurality of first fins; and the first fins being outward extended from portions of the first radiator elements located adjacent to two opposite lateral sides of the first slot with an opening being formed between any two adjacent first fins.

12. The water-cooling radiator structure as claimed in claim 11, wherein the first and the second coupling sections are provided on the first sealing element and define a first and a second water-guiding hole, respectively; the first and the second water-guiding holes extending through the first and the second coupling sections, respectively, and being fluidly communicable with the first and the second reservoirs, respectively.

13. The water-cooling radiator structure as claimed in claim 12, wherein the first sealing element has a first flow passages sealing section, a plurality of second fins, and two opposite first reservoir sealing sections; the first flow passages sealing section having two opposite ends integrally connected to the two first reservoir sealing sections and being located and extended between the two first reservoir sealing sections; the first flow passages sealing section and the two first reservoir sealing sections having one side connected to the upper side of the first water-cooling radiator main body to seal the top of the first flow passages and the tops of the first and second reservoirs, respectively; the first and the second coupling sections being respectively provided on one of the two first reservoir sealing sections; and the second fins being outward extended from two opposite lateral sides of the first flow passages sealing section.

14. The water-cooling radiator structure as claimed in claim 13, wherein the second sealing element has a second flow passage sealing section, a plurality of third fins, and two opposite second reservoir sealing sections; the second flow passage sealing section having two opposite ends integrally connected to the two second reservoir sealing sections and being located and extended between the two second reservoir sealing sections; the second flow passage sealing section and the two second reservoir sealing sections having one side connected to the lower side of the first water-cooling radiator main body to seal the bottom of the first flow passages and the bottoms of the first and second reservoirs, respectively; and the third fins being outward extended from two opposite lateral sides of the second flow passage sealing section.

15. The water-cooling radiator structure as claimed in claim 10, wherein the first and the second sealing elements are sheet members made of a metal material, and the first radiator elements are sheet members made of a metal material; and the second sealing element, the first radiator elements and the first sealing element being sequentially stacked from bottom to top and then integrally connected together through heat treating to form the water-cooling radiator structure.

16. The water-cooling radiator structure as claimed in claim 10, further comprising a plurality of second radiator elements, a third coupling section, a fourth coupling section, and a third sealing element; the second radiator elements being stacked between the second and the third sealing elements to form a second water-cooling radiator main body; each of the second radiator elements having a second slot, a third communicating opening and a fourth communicating opening, which penetrate the second radiator elements in a thickness direction thereof; the second slot on each second radiator element being located between and fluidly communicable with the third and the fourth communicating openings; the second slots of the stacked second radiator elements together defining a second flow passage on the second water-cooling radiator main body, and the third and the fourth communicating openings on the stacked second radiator elements defining a third reservoir and a fourth reservoir, respectively, on the second water-cooling radiator main body; the second sealing element having another side and the third sealing element having one side being connected to an upper and a lower side, respectively, of the second water-cooling radiator main body to seal tops and bottoms, respectively, of the second flow passage, the third reservoir and the fourth reservoirs; the third reservoir being fluidly communicable with the fourth reservoir via the second flow passage; the third coupling section being provided on the third sealing element on one side of the second water-cooling radiator main body located adjacent to the third reservoir, and the fourth coupling section being provided on the third sealing element on another side of the second water-cooling radiator main body located adjacent to the fourth reservoir; and the third and the fourth coupling sections being fluidly communicable with the second flow passage.

17. The water-cooling radiator structure as claimed in claim 16, wherein the third and the fourth coupling sections are provided on the third sealing element and define a third and a fourth water-guiding hole, respectively; the third and the fourth water-guiding holes extending through the third and the fourth coupling sections, respectively, and being fluidly communicable with the third and the fourth reservoirs, respectively.

18. The water-cooling radiator structure as claimed in claim 17, wherein each of the second radiator elements has a plurality of first radiating fins; and the first radiating fins being outward extended from portions of the second radiator elements located adjacent to two opposite lateral sides of the second slot with a heat-dissipating opening being formed between any two adjacent first radiating fins.

19. The water-cooling radiator structure as claimed in claim 18, wherein the third sealing element has a flow passage sealing section, a plurality of second radiating fins, and two opposite reservoir sealing sections; the flow passage sealing section having two opposite ends integrally connected to the two reservoir sealing sections and being located and extended between the two reservoir sealing sections; the flow passage sealing section and the two reservoir sealing sections having one side connected to the lower side of the second water-cooling radiator main body to seal the bottom of the second flow passage and the bottoms of the third and fourth reservoirs, respectively; the third and the fourth coupling sections being respectively provided on one of the two reservoir sealing sections; and the second radiating fins being outward extended from two opposite lateral sides of the flow passage sealing section.

20. The water-cooling radiator structure as claimed in claim 16, wherein the first, the second and the third sealing elements are sheet members made of a metal material, and the first and the second radiator elements are sheet members made of a metal material; and the third sealing element, the second radiator elements, the second sealing element, the first radiator elements and the first sealing element being sequentially stacked from bottom to top and then integrally connected together through heat treating to form the water-cooling radiator structure.

21. The water-cooling radiator structure as claimed in claim 10, further comprising two opposite casings connected to two opposite lateral sides of the water-cooling radiator structure; the casings respectively having a plurality of retaining sections outward extended from one side of the casings to abut on outer surfaces of the first and the second sealing elements.

22. The water-cooling radiator structure as claimed in claim 10, wherein the first and the second communicating openings on the first radiator element are located side by side with a partitioning section provided at a joint between the first and the second communicating openings; the partitioning section separating and preventing the first and the second communicating openings from directly communicating with each other; and the first and the second communicating openings being indirectly communicable with each other via the plurality of first slots.

23. The water-cooling radiator structure as claimed in claim 22, wherein each of the first radiator elements has a plurality of first fins; and the first fins being outward extended from portions of the first radiator elements located adjacent to two opposite lateral sides of the plurality of first slots with an opening being formed between any two adjacent first fins.

24. The water-cooling radiator structure as claimed in claim 23, wherein the first and the second coupling sections are provided on the first sealing element and define a first and a second water-guiding hole, respectively; the first and the second water-guiding holes extending through the first and the second coupling sections, respectively, and being fluidly communicable with the first and the second reservoirs, respectively.

\* \* \* \* \*